(12) United States Patent
Blank

(10) Patent No.: US 9,299,598 B2
(45) Date of Patent: Mar. 29, 2016

(54) ROBOT WITH INTEGRATED ALIGNER

(71) Applicant: Lam Research Corporation, Fremont, CA (US)

(72) Inventor: Richard M. Blank, San Jose, CA (US)

(73) Assignee: Lam Research Corp., Fremont, CA (US)

( * ) Notice: Subject to any disclaimer, the term of this patent is extended or adjusted under 35 U.S.C. 154(b) by 158 days.

(21) Appl. No.: 14/139,362

(22) Filed: Dec. 23, 2013

(65) Prior Publication Data
US 2015/0179488 A1    Jun. 25, 2015

(51) Int. Cl.
*H01L 21/68*   (2006.01)
*H01L 21/677*  (2006.01)

(52) U.S. Cl.
CPC .......... *H01L 21/68* (2013.01); *H01L 21/67742* (2013.01); *Y10S 414/136* (2013.01)

(58) Field of Classification Search
CPC ............................... B25J 9/042; H01L 21/677
USPC .................... 414/744.2–744.5, 783
See application file for complete search history.

(56) References Cited

U.S. PATENT DOCUMENTS

| | | | |
|---|---|---|---|
| 5,102,280 A * | 4/1992 | Poduje et al. | 414/744.5 |
| 6,275,742 B1 | 8/2001 | Sagues et al. | |
| 6,496,026 B1 * | 12/2002 | Long et al. | 324/750.16 |
| 6,752,585 B2 * | 6/2004 | Reimer et al. | 414/783 |
| 7,701,232 B2 | 4/2010 | Parrish | |
| 7,959,400 B2 | 6/2011 | Hagio et al. | |
| 8,139,219 B2 | 3/2012 | George | |
| 8,319,510 B2 | 11/2012 | Ogino et al. | |
| 2009/0082895 A1 * | 3/2009 | Barker | H01L 21/67742 700/112 |
| 2010/0215460 A1 * | 8/2010 | Watanabe et al. | 414/217 |

* cited by examiner

*Primary Examiner* — Ernesto Suarez
*Assistant Examiner* — Ronald Jarrett
(74) *Attorney, Agent, or Firm* — Weaver Austin Villeneuve & Sampson LLP

(57) ABSTRACT

A robot with an integrated aligner is provided that allows for the alignment of a semiconductor wafer while the semiconductor wafer transits between multiple stations. The robot with an integrated aligner may contain a rotational wafer support configured to rotate and/or translate, one or multiple robotic arms, and a sensor. The robot may pick and place the semiconductor wafer with the robotic arm from or into a station and from or onto the rotational wafer support. The robot may be configured to rotate the semiconductor wafer into a desired orientation when the semiconductor wafer is on the rotational wafer support. The rotation of the semiconductor wafer into a desired orientation may be aided the sensor. The robot may have a positioning mechanism which moves it between different positions in a semiconductor tool.

15 Claims, 16 Drawing Sheets

ROBOT WITH INTEGRATED ALIGNER

BACKGROUND

Semiconductor wafers often need to be oriented or re-oriented, e.g., rotated, clocked, or indexed, before or after being transferred into or out of a semiconductor process chamber. The semiconductor wafer orientations required for each semiconductor process chamber in a semiconductor processing tool may be different and semiconductor wafers may need to be re-oriented before undergoing processing in each semiconductor process chamber.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, an apparatus for use with semiconductor processing equipment may be provided. The apparatus may include a base configured to be installed in a semiconductor tool, a rotatable wafer support configured to rotate about a rotational axis, and a first robotic arm. The rotatable wafer support may be directly or indirectly supported by the base, and be configured to support a semiconductor wafer such that the semiconductor wafer is substantially centered on the rotational axis. The first robotic arm may include a first end rotatably connected to the base and a second end configured to support the semiconductor wafer. The first robotic arm may be configured to place the semiconductor wafer on the rotatable wafer support and the rotatable wafer support may be configured to rotate the semiconductor wafer after the semiconductor wafer is placed on the rotatable wafer support.

In some implementations of the apparatus, the first robotic arm may be a multi-link arm. In some such implementations, the first robotic arm may further include a first link connected to the base, a second link connected to the first link, a first pivot joint, and a second pivot joint. The first pivot joint may provide for rotational motion of the first link with respect to the base and about a first pivot rotational axis. The second pivot joint may provide for rotational motion of the second link with respect to the first link about a second pivot rotational axis. There may be a first link distance defined as the distance between the first pivot rotational axis and the second pivot rotational axis and a second link distance defined as the distance between the second pivot rotational axis and a wafer reference axis. The first link distance may be less than the second link distance. The wafer reference axis may be defined as being coaxial with a wafer center axis of the semiconductor wafer when the semiconductor wafer is supported by the second end. In some such implementations, the multi-link arm may include at least two links and the two links may be configured to be at an acute angle with respect to one another when the first robotic arm is in position for placing the semiconductor wafer on the rotatable wafer support.

In some other or additional implementations, the apparatus may further include a sensor. The sensor may be configured to determine when the semiconductor wafer is in an aligned position on the rotatable wafer support.

In some other or additional implementations, the apparatus may further include a rotatable wafer support translation mechanism configured to translate the rotatable wafer support relative to the base in a plane substantially normal to the rotational axis.

In some other or additional implementations, the apparatus may further include a second robotic arm. In some further such implementations, the apparatus may further include a positioning mechanism configured to translate the base, including the first robotic arm and the rotatable wafer support, from a first position to a second position.

In some implementations, a semiconductor wafer handling method may be provided. The method may include picking a first semiconductor wafer from a first location with a first robotic arm supported by a base and, using the first robotic arm, placing the first semiconductor wafer on a rotatable wafer support. The rotatable wafer support may be configured to rotate about a rotational axis and supported by the base. The first semiconductor wafer may be placed on the rotatable wafer support, such that the first semiconductor wafer is substantially centered on the rotational axis. The method may further include aligning the first semiconductor wafer by rotating the rotatable wafer support; moving the base, including the first robotic arm, the rotatable wafer support, and the first semiconductor wafer, from a first position to a second position; picking the first semiconductor wafer from the rotatable wafer support with the first robotic arm; and placing the first semiconductor wafer into a second location with the first robotic arm.

In some such implementations, the method may further include aligning of the first semiconductor wafer by rotating the rotatable wafer support during a first time period and moving of the base from the first position to the second position during a second time period. The first time period and the second time period may at least partially overlap.

In some other or additional implementations of the method, the aligning of the first semiconductor wafer may further include rotating the first semiconductor wafer by a first predetermined amount, and rotating the first semiconductor wafer by a second amount until an alignment feature on the first semiconductor wafer is detected by a sensor as being in an aligned orientation.

In some other or additional implementations, the method may further include translating the rotatable wafer support from a third position to a fourth position with respect to the base while the rotatable wafer support is supporting the first semiconductor wafer.

In some other or additional implementations, the method may further include picking a second semiconductor wafer from a third location with a second robotic arm supported by the base and placing, using the second robotic arm, the second semiconductor wafer on the rotatable wafer support such that the second semiconductor wafer is substantially centered on the rotational axis. The method may additionally include moving the base, including the first robotic arm, the second robotic arm, the rotatable wafer support, the first semiconductor wafer, and the second semiconductor wafer from a first position to a second position, aligning the second semiconductor wafer by rotating the rotatable wafer support, picking the second semiconductor wafer from the rotatable wafer support with the second robotic arm, and placing the second semiconductor wafer into a fourth location with the second robotic arm.

In some other or additional implementations of the method, the aligning of the first semiconductor wafer by rotating the rotatable wafer support occurs during a first time period. The moving of the base from the first position to the second position occurs during a second time period. The aligning of the second semiconductor wafer by rotating the rotatable wafer support occurs during a third time period. The second time period at least partially overlaps with at least one of the first time period and the third time period.

In some implementations, an apparatus may be provided that includes a positioning mechanism, a base, a rotatable wafer support, and a first robotic arm. The positioning mechanism may be configured to move the base between a plurality of positions within the apparatus. The rotatable wafer support may be configured to rotate about a rotational axis, may be directly or indirectly supported by the base, may move with the base, and may be configured to support a semiconductor wafer. The first robotic arm may include a first end rotationally connected to the base and a second end configured to support the semiconductor wafer. The first robotic arm may be configured to place the semiconductor wafer on the rotatable wafer support such that the semiconductor wafer is substantially centered on the rotational axis and the rotatable wafer support may be configured to rotate the semiconductor wafer about the rotational axis after the semiconductor wafer is placed on the rotatable wafer support.

In some such implementations of the apparatus, the first robotic arm may be a multi-link arm. In some such implementations, the first robotic arm may further include a first link connected to the base, a second link connected to the first link, a first pivot joint, and a second pivot joint. The first pivot joint may provide for rotational motion of the first link with respect to the base and about a first pivot rotational axis. The second pivot joint may provide for rotational motion of the second link with respect to the first link about a second pivot rotational axis. A first link distance, defined as the distance between the first pivot rotational axis and the second pivot rotational axis, may be less than a second link distance, defined as the distance between the second pivot rotational axis and a wafer reference axis. The wafer reference axis may be defined as being coaxial with a wafer center axis of the semiconductor wafer when the semiconductor wafer is supported by the second end. In some other or additional implementations, the multi-link arm may include at least two links and the two links may be configured to be at an acute angle with respect to one another when the first robotic arm is in position for placing the semiconductor wafer on the rotatable wafer support.

In some other or additional implementations of the apparatus, the positioning mechanism may include a track guide.

In some implementations, an apparatus may be provided that includes a first location, a second location, a base configured to be movable between different positions within the apparatus, a rotatable wafer support directly or indirectly supported by the base, a first robotic arm, and a controller. The rotatable wafer support may be configured to support a semiconductor wafer. The first robotic arm may include a first end rotationally connected to the base and a second end configured to support the semiconductor wafer. The controller may include one or more processors and a memory. The one or more processors, the memory, the first robotic arm, and the rotatable wafer support may be communicatively coupled and the memory may store program instructions for controlling the one or more processors to cause the first robotic arm to pick the semiconductor wafer from the first location, cause the first robotic arm to place the semiconductor wafer on the rotatable wafer support, cause the rotatable wafer support to align the semiconductor wafer after the semiconductor wafer is placed on the rotatable wafer support by rotating the rotatable wafer support, cause the first robotic arm to pick the semiconductor wafer from the rotatable wafer support after the semiconductor wafer has been aligned, and cause the first robotic arm to place the semiconductor wafer into the second location.

In some such implementations of the apparatus, the first location may be a semiconductor wafer cassette.

In some other or additional implementations of the apparatus, the second location may be a load-lock.

In some other or additional implementations of the apparatus, the memory may further include program instructions for controlling the one or more processors to cause the base to move from a first position to a second position as well as from the second position to the first position.

In some other or additional implementations, the apparatus may further include a second robotic arm. The one or more processors, the memory, the first robotic arm, the second robotic arm, and the rotatable wafer support may be communicatively coupled. The memory may store further program instructions for controlling the one or more processors to cause the second robotic arm to pick a second semiconductor wafer from a third location, cause the second robotic arm to place the second semiconductor wafer on the rotatable wafer support, cause the rotatable wafer support to align the second semiconductor wafer after the second semiconductor wafer is placed on the rotatable wafer support by rotating the rotatable wafer support, cause the second robotic arm to pick the second semiconductor wafer from the rotatable wafer support after the second semiconductor wafer has been aligned, and cause the second robotic arm to place the semiconductor wafer into the second location or a fourth location.

These and other aspects of this disclosure are explained in more detail with reference to the accompanying Figures listed below.

DETAILED DESCRIPTION

Figure 1A:
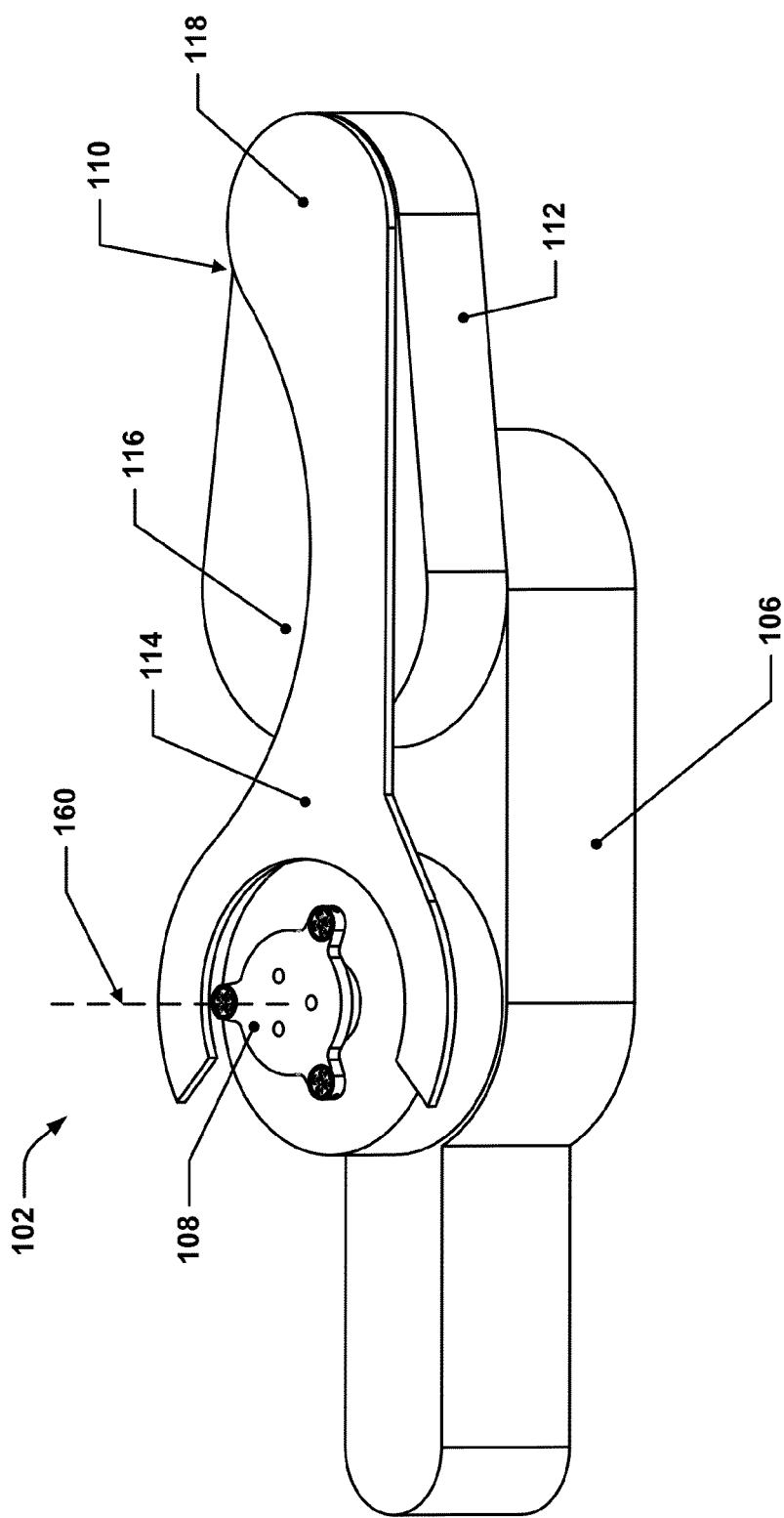
FIG. 1A shows an off-angle view of an example of a robot including a rotatable wafer support, a base, and a robotic arm.

The present inventor has conceived of a robot with an integrated wafer aligner that is able to pick and place semiconductor wafers and align the semiconductor wafers in between the pick and place operations, e.g., while the robot is moving between pick and place locations. A robot with an integrated aligner may include a base, a robotic arm, and a rotatable wafer support. The base may be configured to support the rotatable wafer support and the robotic arm. In addition, in various implementations the base also may support a sensor and/or include a positioning mechanism to move the base between multiple locations such as pick and place locations. The rotatable wafer support may be configured to support and rotate a semiconductor wafer with respect to the base. In some implementations, the rotatable wafer support may also be configured to translate with respect to the base. The robot may have one or more robotic arms, e.g., robotic arms with one or more links. The robotic arm(s) may be configured to pick and place semiconductor wafers from semiconductor process chambers and the rotatable wafer support. The movement of the robot, including movement of the base, the robotic arm or arms, and the rotatable wafer support, may be controlled by a controller configured to drive various motors and other actuators that provide motion to the robot.

It is to be understood that, as used herein, the term "semiconductor wafer" refers both to wafers that are made of a semiconductor material, e.g., silicon, and wafers that are made of materials that are not generally identified as semiconductors, e.g., epoxy, but that have semiconductor materials deposited on them during a semiconductor manufacturing process. Alignment of both types of wafer is considered to be within the scope of this disclosure.

As discussed previously, semiconductor wafers may need to be oriented in a specific orientation when they are processed in a semiconductor process chambers. For example, semiconductor wafers may need to be oriented in a specific orientation to align a feature on the semiconductor wafer with a feature in the semiconductor process chamber to prevent process gas from getting to the backside of the semiconductor wafer during semiconductor wafer processing. Semiconductor wafers may also or alternatively need to be oriented in a specific orientation to allow proper diagnosis of a location in a semiconductor process machine producing bad process results. Additionally or alternatively, semiconductor wafers may need to be oriented in a specific orientation to allow sensors to avoid features on the semiconductor wafer that could affect the sensors. Some examples of semiconductor processes where a specific wafer orientation may be required include deposition and etch processes.

Semiconductor wafers may be moved between semiconductor process chambers with robots. One conventional approach to wafer alignment is to have a wafer alignment chamber that is attached to a semiconductor tool. A wafer handling robot may place a semiconductor wafer into the wafer alignment chamber, where a wafer alignment device may rotate the semiconductor wafer into a desired alignment. During alignment, the robot may perform other tasks or may wait for alignment to complete. After alignment, the robot may pick the aligned semiconductor wafer from the wafer alignment device and then transfer it to a process chamber that is also attached to the semiconductor tool.

By contrast, a robot with an integrated aligner allows the semiconductor wafer to be aligned while the robot is moving the semiconductor wafer between stations, e.g., semiconductor process chambers, loadlocks, front-opening unified pods (FOUPs), etc., or combinations thereof. This may reduce the amount of time spent on non-processing, wafer-handling operations and may reduce the overall process time needed to produce semiconductor wafers, thus increasing throughput. The use of a robot with an integrated aligner also allows the space that may have been used to provide a wafer alignment chamber to be freed up for other purposes, e.g., for an additional process chamber.

FIG. 1A shows an off-angle view of an example of a robot including a rotatable wafer support, a base, and a robotic arm. A robot 102 is shown and includes a base 106, a robotic arm 110, and a rotatable wafer support 108. In this implementation, the robotic arm 110 is a two-link arm and includes a first link 112 and a second link 114. The first link 112 may be connected to the base 106 through a first pivot joint 116. The second link 114 may be connected to the first link 112 through a second pivot joint 118. In other implementations, the robotic arm may only include one link or have more than two links (and correspondingly fewer or more pivot joints).

For multi-link robotic arms such as robotic arm 110, individual links may move dependently or independently of other links in the robotic arm. When individual links are configured to move independently of other links, multiple motors may be required to move the robotic arm. When individual links are configured to move dependently of other links, only a single motor may be required to extend/retract the robotic arm. Individual links may also have equal or unequal pivot-to-pivot distances. The second link 114 may include an end effector configured to support a semiconductor wafer. The robotic arm 110 may be configured to pick the semiconductor wafer from a first location, e.g., a first station, place the semiconductor wafer on the rotatable wafer support 108, pick the semiconductor wafer from the rotatable wafer support 108 after alignment of the semiconductor wafer is performed by the rotatable wafer support 108, and place the semiconductor wafer into a second location, e.g., a second station.

In certain implementations, the robotic arm 110 may be configured to be movable between at least two configurations: a retracted configuration and an extended configuration. The robotic arm 110 may be configured to pick/place semiconductor wafers from/in stations in the extended configuration. In the retracted configuration, the robotic arm 110 may be configured to allow placing/picking of a semiconductor wafer on/from the rotatable wafer support 108. In the retracted configuration, the first link 112 and the second link 114 may form an acute angle. In some implementations, the robotic arm 110 may be configured to be movable between additional configurations beyond the retracted configuration and the extended configuration, e.g., multiple extended configurations involving different extension distances. In many implementations, the robotic arm 110 also may be configured to rotate. The robotic arm 110 may rotate independently of its movement between any retracted, extended, or other configurations that the robotic arm 110 may move between.

The robotic arm 110 may be driven by a motor or motors, e.g., stepper motors, mounted on the robot 102 or mounted elsewhere with a drive mechanism connected to the robotic arm 110.

The rotatable wafer support 108 may be configured to rotate about a rotational axis 160 and thereby rotate a semiconductor wafer supported by the rotatable wafer support 108 about an axis parallel to (and often substantially coaxial with) the semiconductor wafer's center axis until the semiconductor wafer is in a desired rotational orientation. The rotatable wafer support 108 may be configured to rotate in a clockwise direction, a counterclockwise direction, or, in some implementations, in either direction. The rotatable wafer support 108 may be driven by a motor, e.g. a stepper motor or other drive mechanism, mounted on the robot 102 or it may be driven by a motor mounted elsewhere with a drive mechanism connecting to the rotatable wafer support 108. The rotatable wafer support 108 may have features for supporting semiconductor wafers such as pads, grips, notches, detents, or other supporting features.

In some implementations, the rotatable wafer support 108 also may be configured to provide for translation of the semiconductor wafer along the rotational axis 160, e.g., along the z-axis. In some further or additional implementations, the rotatable wafer support 108 may be configured to translate the semiconductor wafer in a direction substantially normal to the rotational axis 160 in order to assist with centering the wafer on the end effector.

The base 106 may be configured to be installed in a semiconductor tool. In the pictured implementation, both the robotic arm 110 and the rotatable wafer support 108 are directly connected to the base 106. In other implementations, either or both the robotic arm and the rotatable wafer support may be indirectly connected to the base. For example, in some implementations, the robotic arm may be directly connected to the base and the rotatable wafer support may be mounted on the robotic arm, e.g., on top of the first pivot joint 116. In such implementations, the rotatable wafer support may be indirectly connected to the base via the robotic arm. In some other or additional implementations, the robotic arm and/or the rotatable wafer support may be mounted on a platform configured to translate with respect to the base, and the platform may be mounted on the base. In such implementations, both the robotic arm and the rotatable wafer support may be indirectly connected to the base via the platform. Regardless of how the robotic arm(s) and/or rotatable wafer support are connected to the base, the robotic arm(s) and the rotatable wafer support may move as a unit with the base.

Figure 1B:
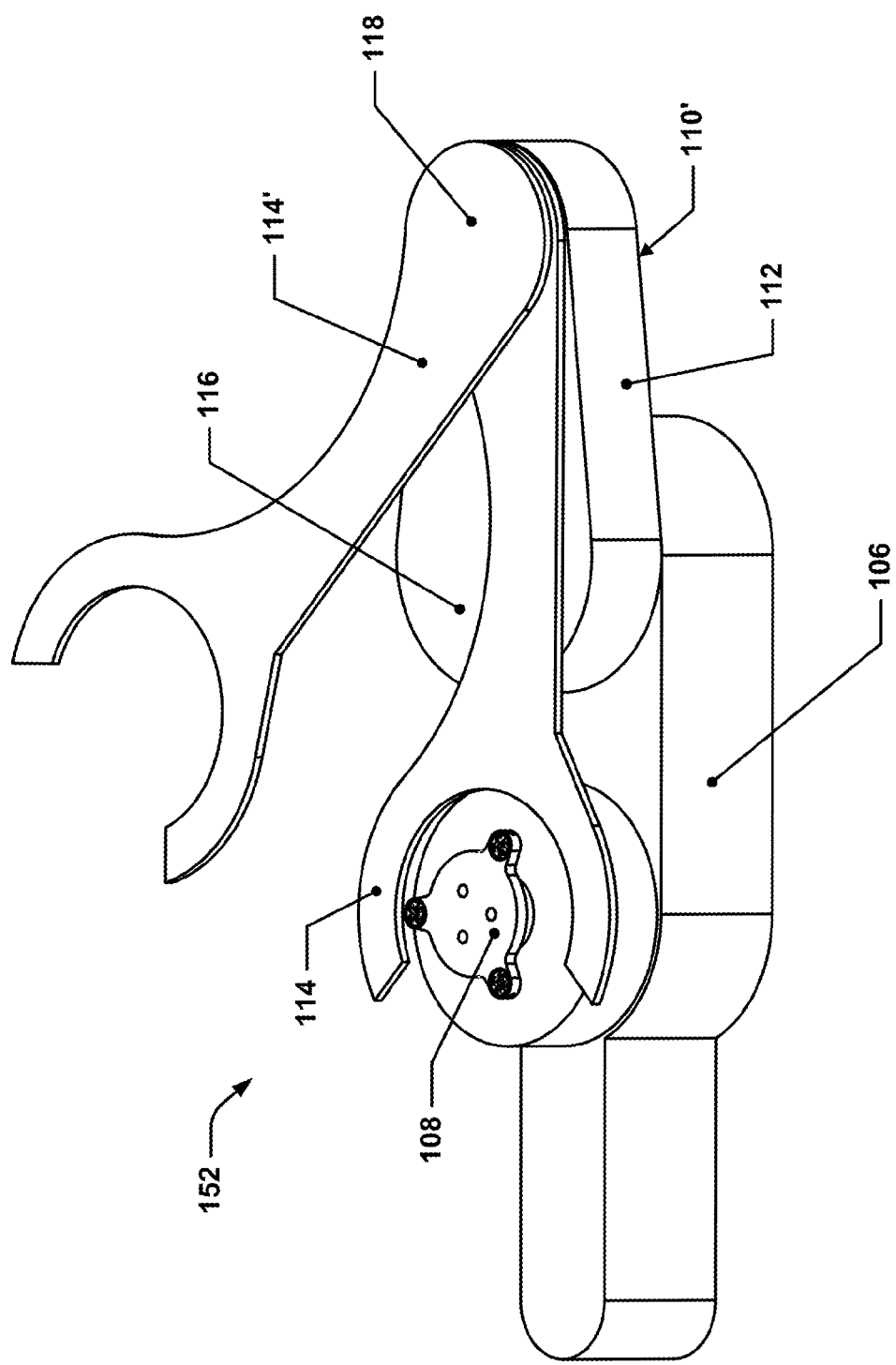
FIG. 1B shows the example robot of FIG. 1A with a second robotic arm.

FIG. 1B shows the example robot of FIG. 1A with a second robotic arm. There may be other implementations of robots with further multiple arms than the specific implementation shown. In the implementation shown, a double-armed robot 152 contains a double robotic arm 110' with an additional second link 114' as compared with the robotic arm of the robot 102 shown in FIG. 1A. The additional second link 114' may, similar to the second link 114, be configured to pick a semiconductor wafer from the first station (or a third station), place the semiconductor wafer on the rotatable wafer support 108, pick the semiconductor wafer from the rotatable wafer support 108 after alignment, and then place the semiconductor wafer into the second station (or into a fourth station). In the pictured implementation, the second link 114' is connected to first link 112. Thus, the additional second link 114' shares the first link 112 with the second link 114. The additional second link 114' is connected to the first link 112 through the second pivot joint 118. The second pivot joint 118 may be configured such that the second link 114 and the additional second link 114' may rotate independently of each other and be separately driven. In certain implementations, there may be a full second robotic arm, e.g., the second robotic arm may have a first link and a second link separate from the first link and the second link of the first robotic arm. In those implementations, the second links will not share the first links, resulting in both robotic arms being potentially kinematically decoupled. In some further implementations, there may be additional robotic arms such as, for example, a third robotic arm.

Figure 1C:
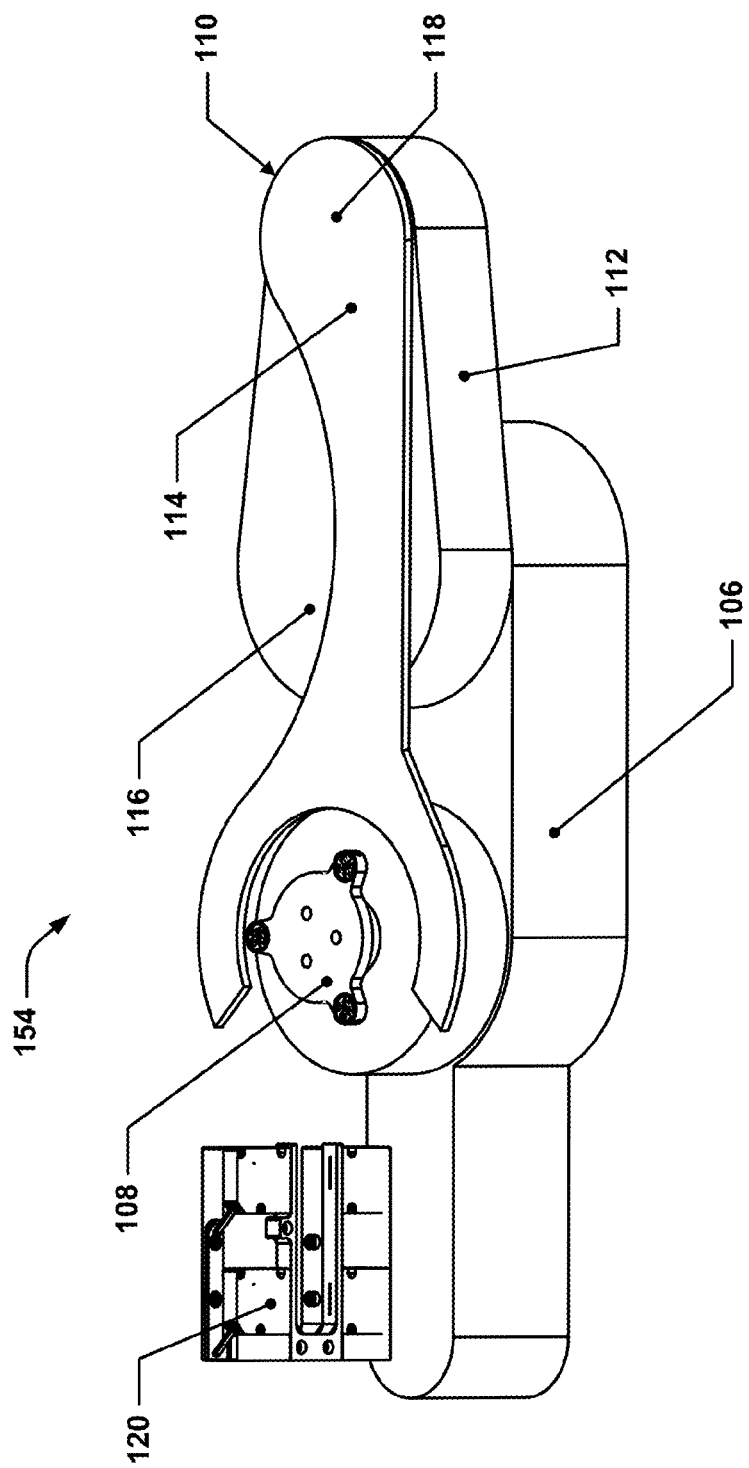
FIG. 1C shows the example robot of FIG. 1A with a sensor.

FIG. 1C shows the example robot of FIG. 1A with a sensor. In the implementation shown, sensor robot 154 includes a sensor 120 to detect when the semiconductor wafer is in a desired orientation relative to the base or some other frame of reference. The semiconductor wafer may have an alignment feature such as a notch, a slot, pattern, or other feature that may be detectable by the sensor 120 and may allow for multiple semiconductor wafers to be oriented to the same angular orientation with regard to a common frame of reference.

The sensor 120 may, for example, be an optical sensor that emits a "curtain" of light that is wide enough to intersect the edge of a substantially circular semiconductor wafer as the semiconductor wafer is rotated. The amount of light from the curtain that passes by the edge of the semiconductor wafer may change gradually (or not at all if the semiconductor is perfectly centered on the rotational axis of the rotatable wafer support) as the semiconductor wafer is rotated about the rotational axis of the rotatable wafer support. However, when an indexing notch on the outer edge of the semiconductor wafer passes through the curtain, there may be a sudden increase in the amount of light from the curtain that passes by the edge. The optical sensor may detect such an increase and such data may be used to determine when the indexing notch, and thus the semiconductor wafer, is in a particular rotational position or orientation. Of course, other sensors may be used as well, including, but not limited to, machine vision sensors (which may move with the base and the robotic arm, or which may observe the robotic arm from a fixed position remote from the base and the robotic arm).

In this implementation, the sensor 120 is mounted on the base 106. Other implementations may have the sensor mounted elsewhere, such as on a platform configured to support the rotatable wafer support, the robotic arm, or on a portion of a semiconductor tool that is fixed with respect to the robotic arm and the base.

Figure 1D:
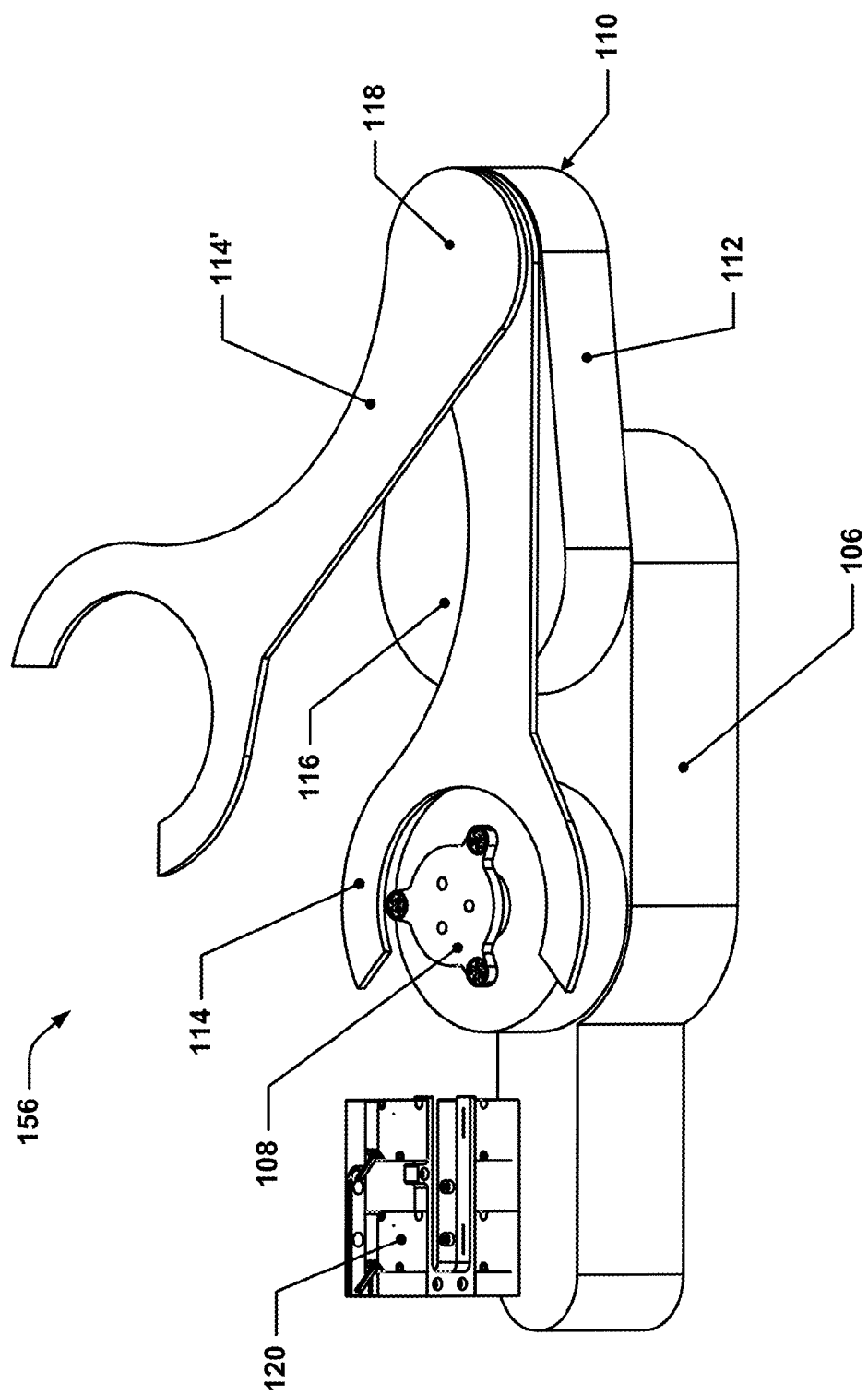
FIG. 1D shows the example robot of FIG. 1A with a second robotic arm and a sensor.

FIG. 1D shows the example robot of FIG. 1A with a second robotic arm and a sensor. In the implementation shown, which may be viewed as a combination of the implementations shown in FIGS. 1B and 1C, double-armed sensor robot 156 includes the additional second link 114' and the sensor 120. The additional second link 114' is substantially similar to the additional second link described in FIG. 1B. The sensor 120 is substantially similar to the sensor described in FIG. 1C (although perhaps sized differently to accommodate two second links). FIG. 1D is an example showing that features of the robots described in FIG. 1A, FIG. 1B, and FIG. 1C may be combined together; indeed, the various components discussed with respect to FIGS. 1A through 1D may be combined in a number of different configurations to facilitate wafer alignment operations as described herein, and the present disclosure is directed not only at the depicted implementations, but towards other implementations as well, including implementations that combine the various components shown in FIGS. 1A through 1D. Other implementations may have additional links, additional arms, sensors mounted in other positions, rotatable wafer supports that translate (or that translate in other directions), or other combinations of such features.

Figure 2:
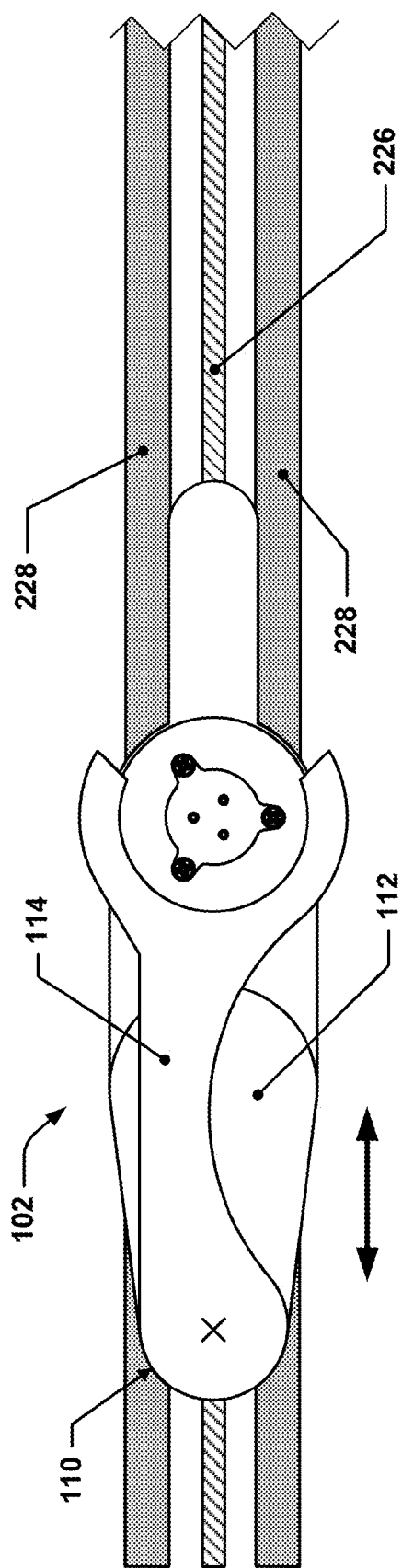
FIG. 2 shows a top-down view of an example of a robot with an integrated aligner on a positioning rail.

FIG. 2 shows a top-down view of an example of a robot with an integrated aligner on a positioning mechanism. The base, the robotic arm, and the rotatable wafer support may be moved from a first position to a second position through the use of the positioning mechanism, e.g., a linear translation system such as a ball screw, linear actuator, etc., that drives the base along a track guide or guides (or other mechanism capable of providing for linear translation). In the implementation of FIG. 2, the robot 102 is supported by a positioning mechanism BB26. The positioning mechanism may be configured to move the base and the robot between multiple positions, allowing the robot to pick and place semiconductor wafers from multiple stations or locations. The robot can then pick a semiconductor wafer while in a first position and place the semiconductor wafer while in a second position. In this disclosure, the robot will be moved to different "positions" while semiconductor wafers will be picked from different "locations".

The positioning mechanism 226 may include, for example, rails and/or guides, pulleys, belts, linear actuators, tracks, wheels, or other mechanisms. In the implementation shown, the positioning mechanism 226 includes track guides 228. Track guides 228 may be a rail system or a conveyor belt system, and robot 102 may be moved along the track guides 228 either through a pulley system, through wheels on the base, by a linear actuator, or another system that may provide linear translation force.

Figure 3:
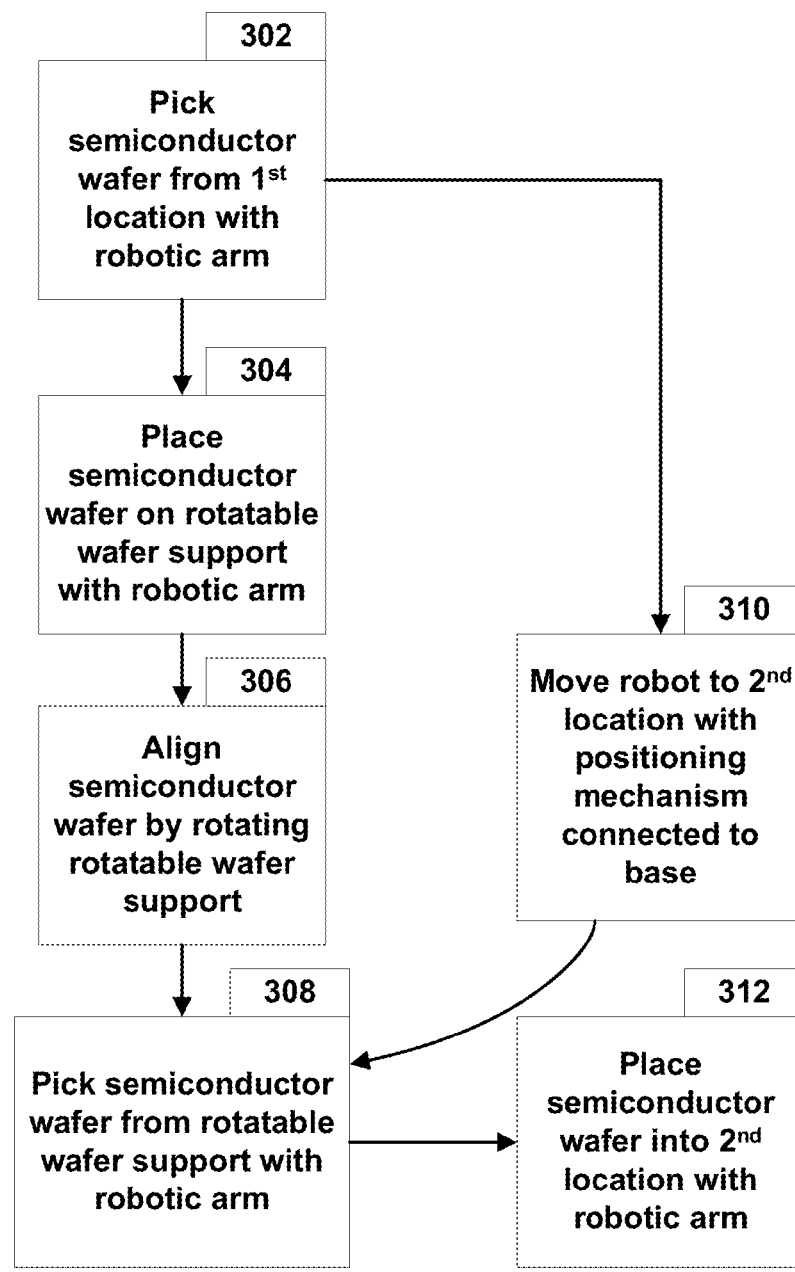
FIG. 3 shows a flow diagram detailing an example of a semiconductor wafer handling technique using a robot with an integrated aligner.

FIG. 3 shows a flow diagram detailing an example technique of semiconductor wafer handling using a robot with an integrated aligner. In some implementations, a system controller (which may include one or more physical or logical controllers) may control some or all of the operations of a robot with an integrated aligner and may be used to practice the technique illustrated in FIG. 3 (and other techniques discussed later herein). The system controller may include one or more memory devices, one or more processors, and other components such as stepper motor controller boards. The processor may include a central processing unit (CPU) or computer, analog and/or digital input/output connections, and other like components. Instructions for implementing appropriate control operations may be executed by the processor. These instructions may be stored on the memory devices associated with or part of the controller or they may be provided over a network. In certain implementations, the system controller executes system control software or logic.

The system control logic may include instructions for controlling the movement of the robotic arm or robotic arms, controlling the movement of the links of the robotic arm, controlling the rotatable wafer support, receiving signals from the sensor, and controlling the positioning mechanism (if present).

System control logic may be provided in any suitable way. For example, in general, the instructions used to control the apparatus may be designed or configured in hardware and/or software. It may be said that the instructions are provided by "programming". The programming may be hard-coded, e.g., in digital signal processors, as part of an application-specific integrated circuit (ASIC), or other devices which have specific algorithms implemented as hardware. In other implementations, programming may be provided as software stored in volatile or non-volatile memory. Programming is also understood to include software or firmware instructions that may be executed on a general purpose processor. System control software may be coded in any suitable computer-readable programming language.

Various subroutines or control objects may be written to control operation of the robot while handling semiconductor wafers. In some implementations, system control software includes input/output control (IOC) sequencing instructions for controlling the various parameters described herein. For example, each phase of a semiconductor wafer rotation process may include one or more instructions for execution by the system controller.

In some implementations, there may be a user interface associated with the system controller. The user interface may include a display screen, graphical software displays of the apparatus and/or process conditions, and user input devices such as pointing devices, keyboards, touch screens, microphones, etc.

In some implementations, parameters relating to operation conditions may be adjusted by the system controller. Non-limiting examples include the size of the semiconductor wafer, the environmental conditions of the semiconductor process chambers, the configuration of the link supporting the semiconductor wafer, desired wafer angular orientations/alignments, etc.

Signals for monitoring the semiconductor wafer handling process may be provided by analog and/or digital input connections of the system controller with various sensors. The signals for controlling the wafer handling process may be received by the controller via analog and/or digital output connections of the robot, rotatable wafer support, and/or sensor. Non-limiting examples of sensors that may be monitored include sensors for measuring the angle of rotation of the semiconductor wafer or the aligned/non-aligned status of the semiconductor wafer, sensors for measuring the position of the base, sensors for monitoring the position(s) of the robotic arm(s), etc. Appropriately programmed feedback and control algorithms may be used with data from these sensors to maintain process control of the robot.

In block 302 the semiconductor wafer may be picked from a first location or station using a robotic arm such as one of those described in FIGS. 1A through 1D. In certain implementations, the semiconductor wafer may be picked from front opening unified pods, load-locks, semiconductor process chambers, transfer chambers, etc., and the first location or station may be associated with one of these pieces of equipment.

After the semiconductor wafer is picked by the robotic arm, the semiconductor wafer may then be placed on a rotatable wafer support, such as that shown in FIGS. 1A through 1D, with the robotic arm, as detailed in block 304. After the semiconductor wafer is placed on the rotatable wafer support, the semiconductor wafer may be rotated by the rotatable wafer support to a desired orientation, as described in block 306. In many implementations, the desired orientation is the orientation suitable for a semiconductor processing step performed after block 312. Whether the semiconductor wafer has been rotated to a desired orientation may be detected with a sensor described in FIG. 1C or 1D, or it may be detected through other technologies such as machine vision or other types of sensors.

In block 308, the robotic arm may pick the semiconductor wafer from the rotatable wafer support after the semiconductor wafer has been rotated to the desired orientation. In block 312, the robot may be moved to the second position and the semiconductor wafer may be placed in the second location by the robotic arm. The second location may be, for example, a semiconductor process chamber, a load-lock, a transfer chamber, or another type of station in a semiconductor processing tool.

The technique of FIG. 3 may also include, during some or all of blocks 304 through 308, moving the robot from a first position to a second position, as shown in block 310. The robot may be moved to the second position during the period where the semiconductor wafer is being placed on the rotatable wafer support by the robotic arm, during the period where the semiconductor wafer is being rotated by the rotatable wafer support, during the period where the semiconductor wafer is picked by the robotic arm from the rotatable wafer support, or during any combination of the periods outlined in blocks 304, 306, and 308. There may also be some movement of the robot to the second position that occurs after block 308 and before block 312. The robot may be moved to the second position using the positioning mechanism that supports the base, as shown in FIG. 2.

Figure 4A:
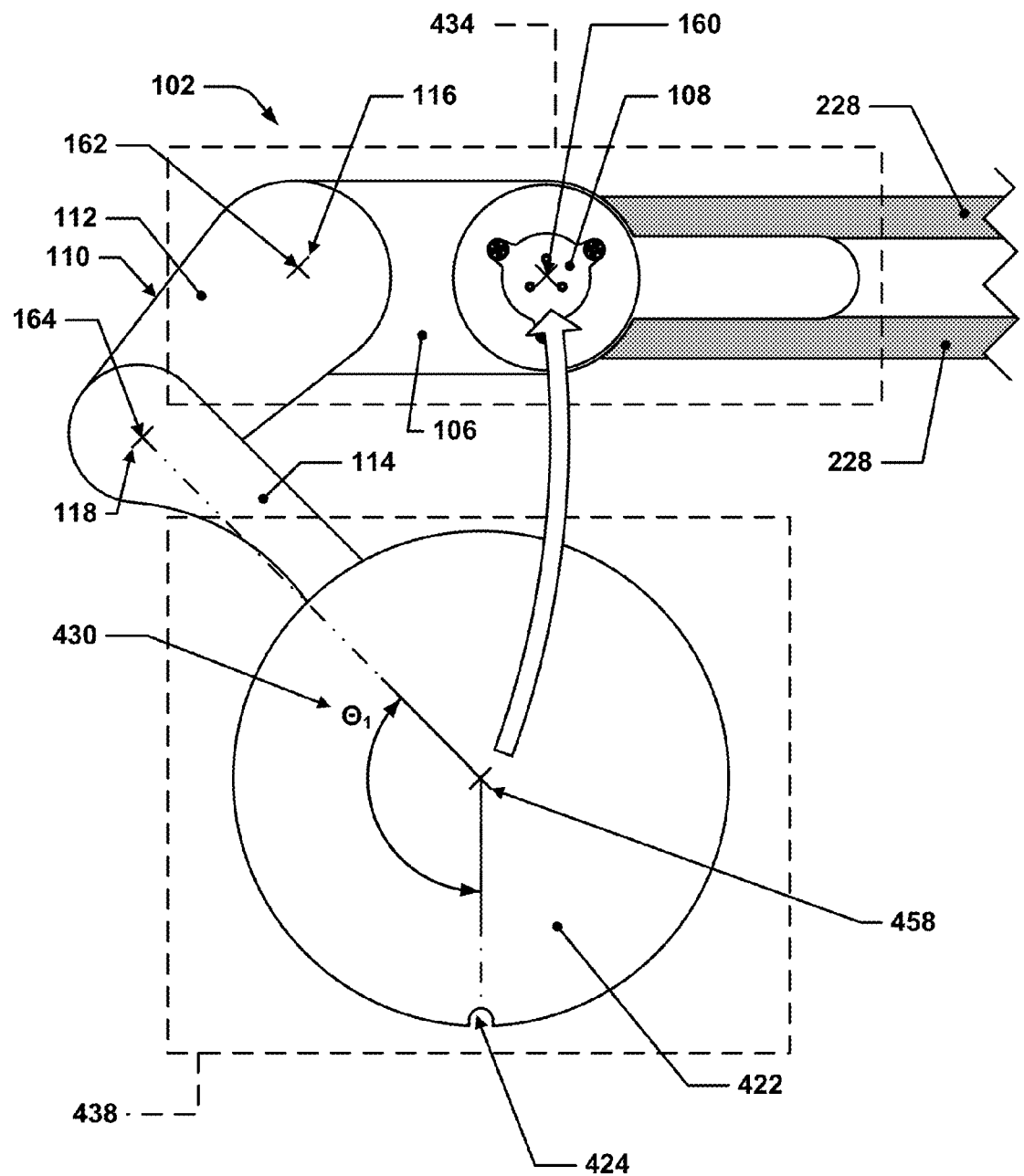
FIG. 4A shows a phase of semiconductor wafer handling by a robot with an integrated aligner.

FIG. 4A shows a phase of the semiconductor wafer handling technique of FIG. 3 by a robot with an integrated aligner. FIG. 4A shows the robot 102, a semiconductor wafer 422, and a first location 438. The configuration of the robot 102 in FIGS. 4A through 4D is similar to the configuration of the robot in FIG. 1A.

The base 106 may be supported by the track guides 228, which may be part of a positioning mechanism for the base. The positioning mechanism may be configured to move the robot from one position to another during semiconductor wafer handling. In FIG. 4A, the robot 102 is in a first position 434 which is selected such that when the robot 102 is in the first position 434, the robotic arm 110 may be able to transition to the extended configuration to reach into the first location 438 to pick the semiconductor wafer 422.

The robotic arm 110 of the robot 102 may be configured in a multitude of different geometries. In the implementation shown in FIG. 4A, the distance between a first pivot rotational axis 162 of the first pivot joint 116 and a second pivot rotational axis 164 of the second pivot joint 118 and the distance between the second pivot rotational axis 118 of the second pivot joint 118 and the wafer center axis 458 may be unequal. In other implementations, the distance between the first pivot rotational axis and the second pivot rotational axis and the distance between the second pivot rotational axis and the wafer center axis may be equal.

Similar to the configuration of the robotic arm in FIG. 1A, the robotic arm 110 in FIG. 4A includes a second link 414. In FIG. 4A, the second link 414 acts as an end effector that holds the semiconductor wafer 422. The semiconductor wafer 422 may be a semiconductor wafer of any size, e.g., a 300 mm diameter semiconductor wafer or a 450 mm semiconductor wafer. The semiconductor wafer 422 may have an alignment feature 424 and a wafer center axis 458.

In FIG. 4A, the semiconductor wafer 422 may be picked by the second link 414 from the first location 438. In FIG. 4A, robotic arm 110 is in the extended configuration. The first location 438 may be a station in a semiconductor process chamber, a front opening unified pod, a load-lock, a transfer chamber, or another station in a semiconductor processing tool. The first location 438 may be nominally defined as being within the dashed rectangular area shown, although the first location 438 may be defined using other shapes and/or boundaries, e.g., the first location 438 may be a circular area substantially coextensive with the semiconductor wafer. In FIG. 4A, the side of the first location 438 closest to the base 106 may be open (or accessible via an access door that may be opened) to allow the second link 114 to pass through. After the second link 414 picks the semiconductor wafer 422 from the first location 438, the robotic arm 110 may move from the extended configuration to the retracted configuration (as shown by the arched arrow next to the robotic arm 110 in this Figure).

In FIG. 4A, the concave geometry of the second link 114 allows the second link 114 to reach deeper into the first location 438 without concurrent translational movement of the base 106 by the positioning mechanism 226 than what would be possible if the second link 114 had straight sides. The degree of concavity may be such that the inside or concave portion of the second link 114 may have a portion that passes beyond the centerline that spans between the second pivot rotational axis 164 and the wafer center axis 458.

In FIG. 4A, the semiconductor wafer 422 is not yet rotated to the desired orientation, which, in this case, is with the wafer alignment feature located substantially along the centerline of the second link 114 and pointing away from the second link 114 (although in other implementations, the desired orientation may be different from that shown). The alignment of the semiconductor wafer may be described through various conventions. For example, when picked from the first location 438, the semiconductor wafer 422 may be in an orientation defined by a first angle 430, which may be formed between a first reference line passing through the second pivot rotational axis 164 and the wafer center axis 458 and a second reference line passing through the wafer center axis 458 and the center of alignment feature 424. It is to be understood that these reference lines are merely used as reference frames and, like all reference frames, other frames of reference may be used as well and are considered to be within the scope of this disclosure.

Figure 4B:
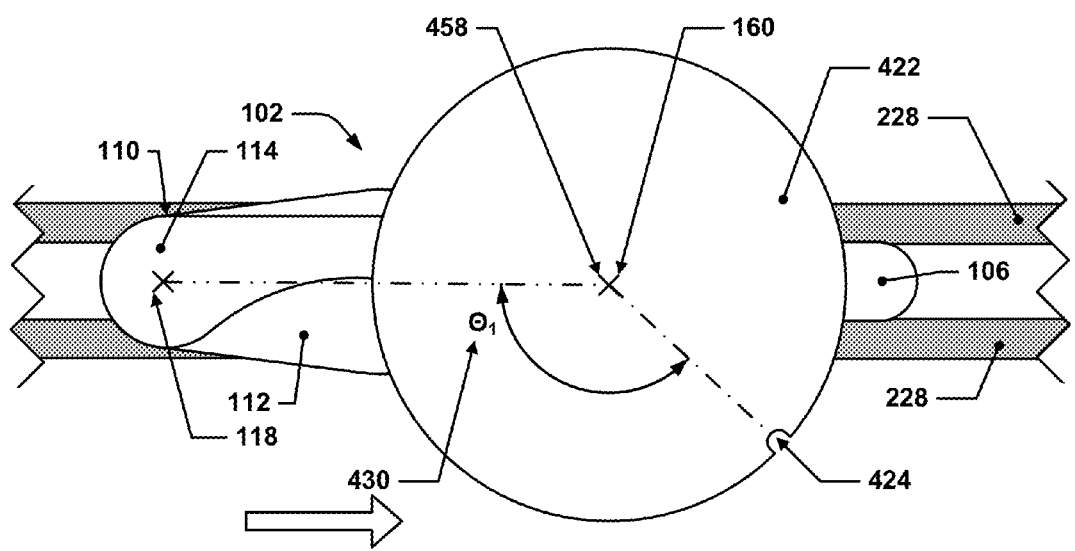
FIG. 4B shows another phase of semiconductor wafer handling by a robot with an integrated aligner.

FIG. 4B shows another phase of semiconductor wafer handling by a robot with an integrated aligner. In FIG. 4B, robotic arm 110 may be in the retracted configuration. In the retracted configuration, the first link 112 and the second link 114 may form an acute angle.

In FIG. 4B, the semiconductor wafer 422 has been placed on the rotatable wafer support. Different implementations may place the semiconductor wafer on the rotatable wafer support through a variety of different approaches. For example, for the implementation shown in FIG. 4B, the semiconductor wafer may be positioned over the rotatable wafer support by the robotic arm, and the robotic arm may then lower the semiconductor wafer onto the rotatable wafer support and then continue to an even lower position after the semiconductor wafer is supported on the rotatable wafer support, leaving the semiconductor wafer supported only by the rotatable wafer support. In another example, the robotic arm may remain stationary in the vertical direction and the rotatable wafer support, or at least portions of the rotatable wafer support that rotate, may rise up to lift the semiconductor wafer off of the robotic arm. Other implementations may include both the robotic arm that can lower the semiconductor wafer onto the rotatable wafer support and then continue to a lower position as well as the rotatable wafer support where at least portions of the rotatable wafer support may rise to lift the semiconductor wafer off of the robotic arm. In either case, the wafer may be supported by the rotatable wafer support and may be free to rotate without contacting the robotic arm after the semiconductor wafer is placed on the rotatable wafer support.

After the semiconductor wafer 422 is placed on the rotatable wafer support 108, the wafer center axis 458 may be coaxial or substantially coaxial with the rotational axis 160. There may be some minor mismatch between the two axes due to tolerancing, slop in the robotic arm, etc., although the semiconductor wafer may be viewed as being generally centered on the rotational axis of the rotatable wafer support. As shown in FIG. 4B, the rotatable wafer support has not yet rotated semiconductor wafer 422 into the desired orientation yet.

Figure 4C:
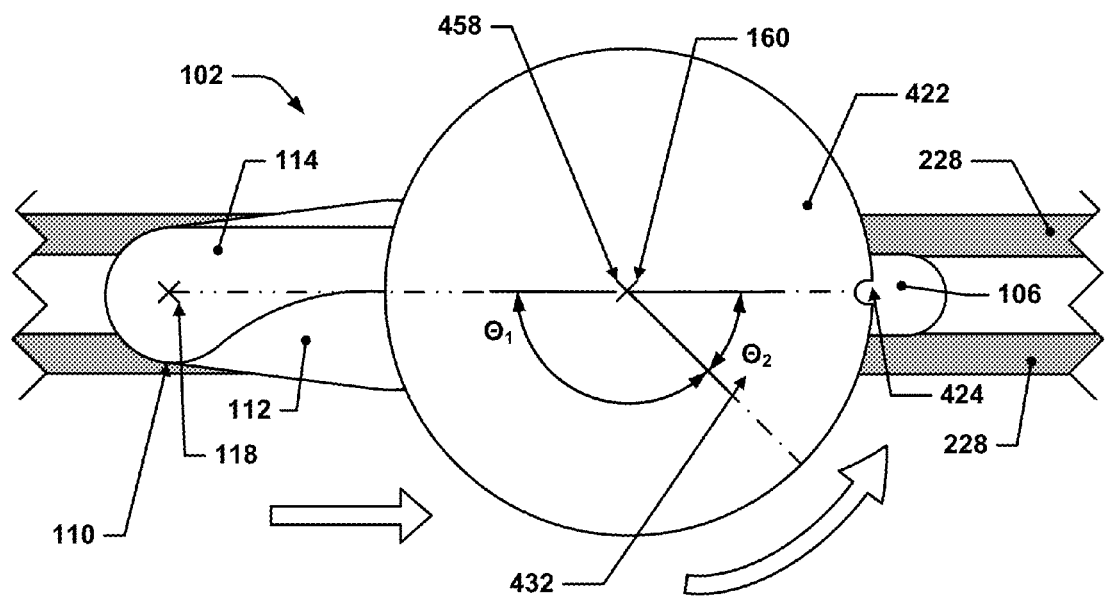
FIG. 4C shows yet another phase of semiconductor wafer handling by a robot with an integrated aligner.
Figure 4D:
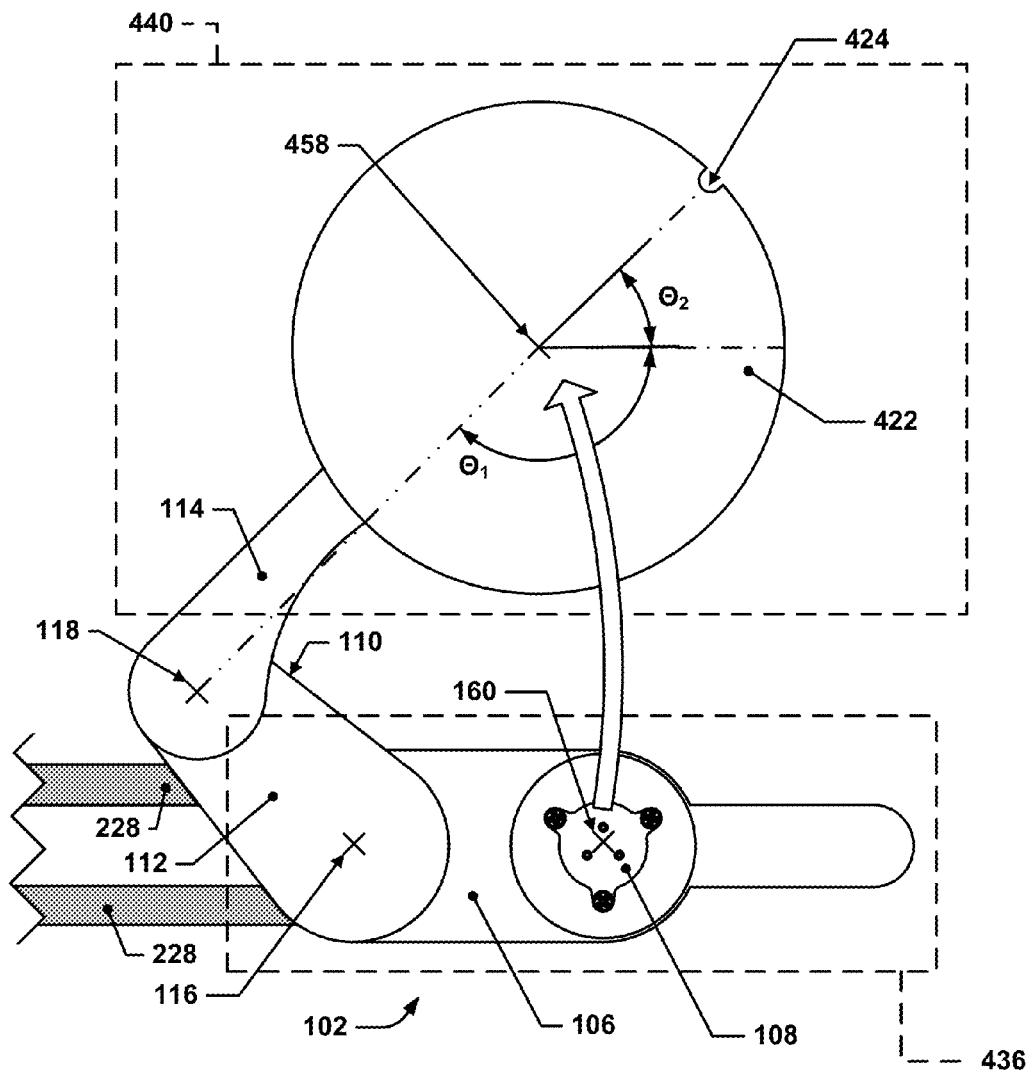
FIG. 4D shows an additional phase of semiconductor wafer handling by a robot with an integrated aligner.

In FIG. 4B, the robot 102 in FIG. 4B is also moving (as shown by the arrow pointing to the right in this Figure) from the first position 434 (not visible in FIG. 4B, but shown in FIG. 4A) to a second position 436 (not visible in FIG. 4B, but shown in FIG. 4D). The semiconductor wafer and the robot 102, including the base, the robotic arm, and the rotatable wafer support, may be moved by the positioning mechanism along track guides 228. The positioning mechanism of the track guides 228 may be similar in configuration to the positioning mechanism in FIG. 2. The robot 102 may be moved from the first position to the second position during at least one of the time periods of one of the implementations described in FIG. 3. In the implementation in FIG. 4B, the positioning mechanism moves the robot 102 in the time period after the semiconductor wafer 422 has been picked by the second link 114 from the first location 438 and before the semiconductor wafer has been placed in the second location 440 by the second link 114. In some implementations, the robot 102 may be moved by the positioning mechanism while robotic arm 110 is moving from the extended configuration to the retracted configuration, although in other implementations, the robot 102 may not begin moving from the first configuration to the second configuration until after the robotic arm is in the retracted configuration.

FIG. 4C shows yet another phase of semiconductor wafer handling by a robot with an integrated aligner. In FIG. 4C, the semiconductor wafer 422 is being rotated by the rotatable wafer support, which may support the semiconductor wafer after the robotic arm places the semiconductor wafer onto the rotatable wafer support, into the desired orientation. The sensor is configured to interact with the alignment feature 424 to detect when the semiconductor wafer 422 is in the desired orientation. The sensor is not shown in FIG. 4C, but is discussed earlier in this disclosure in FIGS. 1C and 1D. When the semiconductor wafer 422 is in the desired orientation, the sensor may detect such alignment and the rotatable wafer support may then be caused to cease rotating semiconductor wafer 422.

In the implementation shown in FIG. 4C, the angle of rotation needed for the semiconductor wafer 422 to be in the desired orientation may be a second angle 432. The second angle 432 may be $\Theta_2$. The $\Theta_2$ needed for a semiconductor wafer to be rotated into the desired orientation may be different for each individual semiconductor wafer, either by design or due to mechanical slop in the wafer handling systems. The rotation through $\Theta_2$ may occur in two or more distinct phases. For example, in the implementation in FIG. 4C, the wafer may first be rotated through an amount less than $\Theta_2$ without using data from the sensor. Such "rough" rotation may be at a higher speed than is used in a subsequent "fine" rotation and may be substantially open loop, i.e., not using data from the sensor (although it may use a position encoder to determine an angular amount through which the rotatable wafer support rotates). After the initial "rough" rotation, a "fine" rotation may be carried out with the assistance of data from the sensor. In this manner, the wafer may be roughly rotationally positioned and then the rotational orientation of the wafer may be more finely tuned using feedback from the sensor, e.g., rotated until the alignment feature is aligned with the sensor. In other implementations, however, all of the rotation may be performed using feedback from the sensor, e.g., a single rotation phase.

Similar to FIG. 4B, the robot 102 in FIG. 4C is also moving (as shown by the arrow pointing to the right in this Figure) from the first position 434 (not visible in FIG. 4C, but shown in FIG. 4A) to the second position 436 (not visible in FIG. 4C, but shown in FIG. 4D). The positioning mechanism of the robot 152 in FIG. 4C may be configured to move the robot 152 in a manner similar to the configuration of the positioning mechanism of the robot in FIG. 4B.

FIG. 4D shows an additional phase of semiconductor wafer handling by a robot with an integrated aligner.

In FIG. 4D, the robot 102 has been moved to the second position 436 by the positioning mechanism of the track guides 228. The positioning mechanism of the track guides 228 may be similar in configuration to the positioning mechanism described in FIG. 2. In this implementation, the positioning mechanism may move the robot 102 to the second position 436 after the robotic arm 110 picks the semiconductor wafer 422 from the first location 438 and before the robotic arm 110 places the semiconductor wafer in the second location 440. The period when the positioning mechanism moves the robot may correspond to block 310 in FIG. 3.

In FIG. 4D, the semiconductor wafer 422 has been rotated into the desired orientation and the robotic arm 110 has picked the semiconductor wafer 422 from the rotatable wafer support 108 and moved it into the second location 440. Different implementations may pick the semiconductor wafer from the rotatable wafer support through a variety of different approaches. For example, for the implementation shown in FIG. 4D, the robotic arm may first be positioned below the semiconductor wafer. The rotatable wafer support may remain stationary in the vertical direction and the robotic arm may rise up to lift the semiconductor wafer off of the rotatable wafer support. In another example, the robotic arm may first be positioned below the semiconductor wafer. The rotatable wafer support, or at least portions of the rotatable wafer support that rotates, then lowers the semiconductor wafer onto the robotic arm and then continues to an even lower position after the semiconductor wafer is supported on the robotic arm, leaving the semiconductor wafer supported only by the robotic arm. Other implementations may contain both the rotatable wafer support where at least portions of the rotatable wafer support can lower the semiconductor wafer onto the robotic arm and then continue to a lower position as well as the robotic arm configured to rise to lift the semiconductor wafer off of the rotatable wafer support. In either case, the semiconductor wafer is supported by the robotic arm and the robotic arm may be free to transition between the retracted and extended configurations with the semiconductor wafer without contacting the rotatable wafer support after the semiconductor wafer is placed on the robotic arm.

After the robotic arm 110 has picked the semiconductor wafer 422 from the rotatable wafer support, the robotic arm 110 may move from the retracted configuration to the extended configuration (as shown by the arched arrow next to the robotic arm 110 in this Figure). In FIG. 4D, the robotic arm 110 may be in the extended configuration such that the semiconductor wafer 422 may be placed in the second location 440. In various implementations, the second location 440 may be a station in a semiconductor process chamber, a front opening unified pod, a load-lock, a transfer chamber, or another station in a semiconductor processing tool. The second location 440 may be nominally defined as being within the dashed rectangular area shown, although the second location 440 may be defined using other shapes and/or boundaries, e.g., the second location 440 may be a circular area substantially coextensive with the semiconductor wafer. In FIG. 4D, the side of the second location 440 closest to the base 106 may be open (or accessible via an access door that may be opened) to allow the second link 114 to pass through.

Figure 5A:
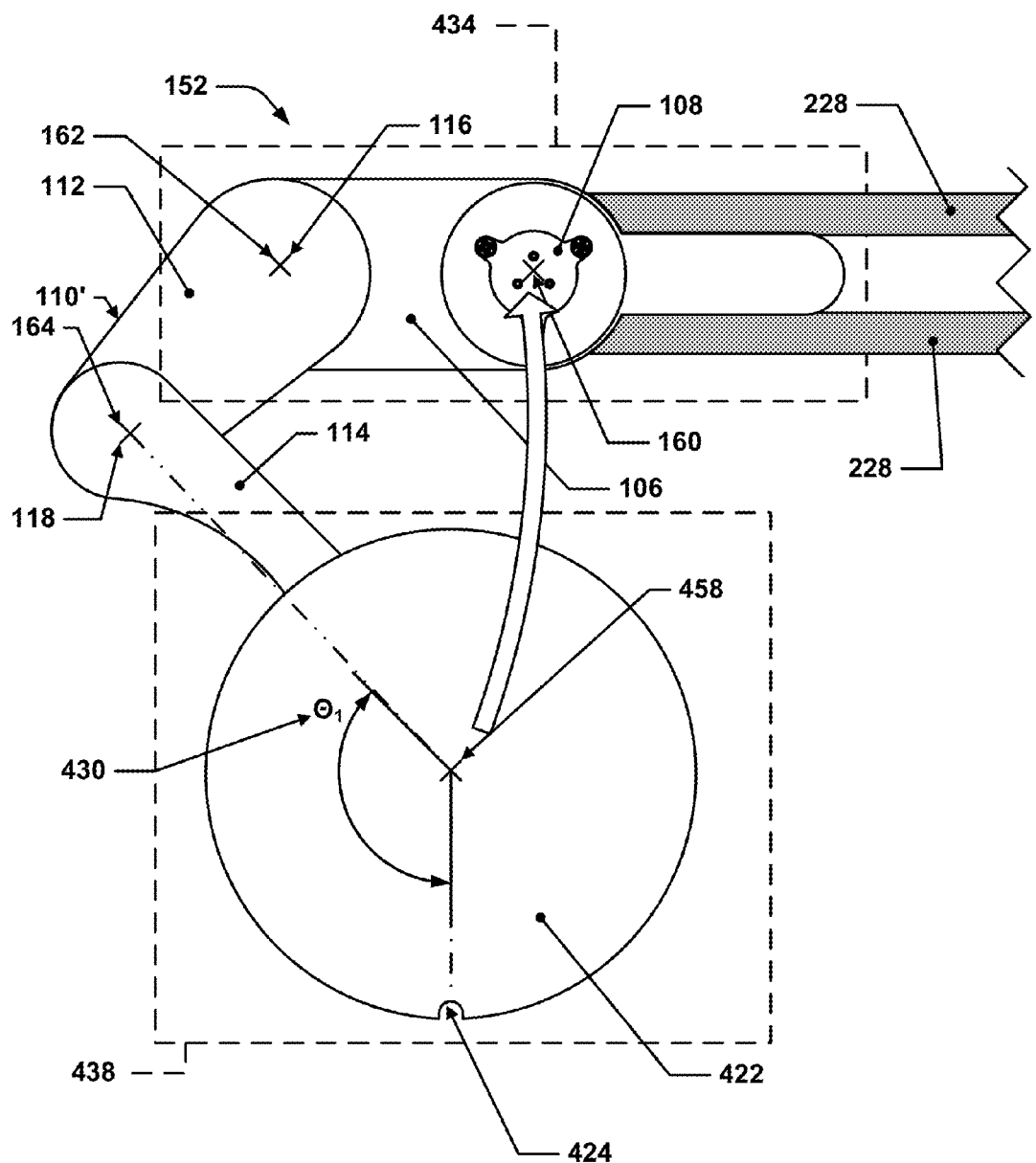
FIG. 5A shows a phase of handling multiple semiconductor wafers by a robot with an integrated aligner including two robotic arms.

FIG. 5A shows a phase of handling multiple semiconductor wafers by a robot with an integrated aligner including two robotic arms. FIG. 5A shows the double-armed robot 152, the semiconductor wafer 422, and the first location 438. Both the second link 114 and the additional second link 114' (not visible in FIG. 5A since the additional second link 114' is directly beneath the second link 114, but shown in FIG. 5B) may act as end effectors that support semiconductor wafers.

The configuration of the double-armed robot 152 in FIGS. 5A through 5D may be similar to the configuration of the robot in FIG. 1B or 1D.

The base 106 may be supported by track guides 228, which may be part of a positioning mechanism for the base. The positioning mechanism configured to move the robot may be similar in configuration to the positioning mechanism in FIGS. 4A to 4D. In FIG. 5A, the double-armed robot 152 may be in the first position 434. The first position 434 may be similar in configuration to the first position in FIG. 4A.

The semiconductor wafer 422, with the alignment feature 424 and the wafer center axis 458, may be similar in configuration to the semiconductor wafer in FIG. 4A.

In FIG. 5A, the double robotic arm 110' is in the extended configuration to pick the semiconductor wafer 422 from the first location 438, similar to how the robotic arm in FIG. 4A may pick a semiconductor wafer. The first location 438 may be similar in configuration to the first location in FIG. 4A and may be any type of station in a semiconductor processing tool as previously discussed.

Figure 5B:
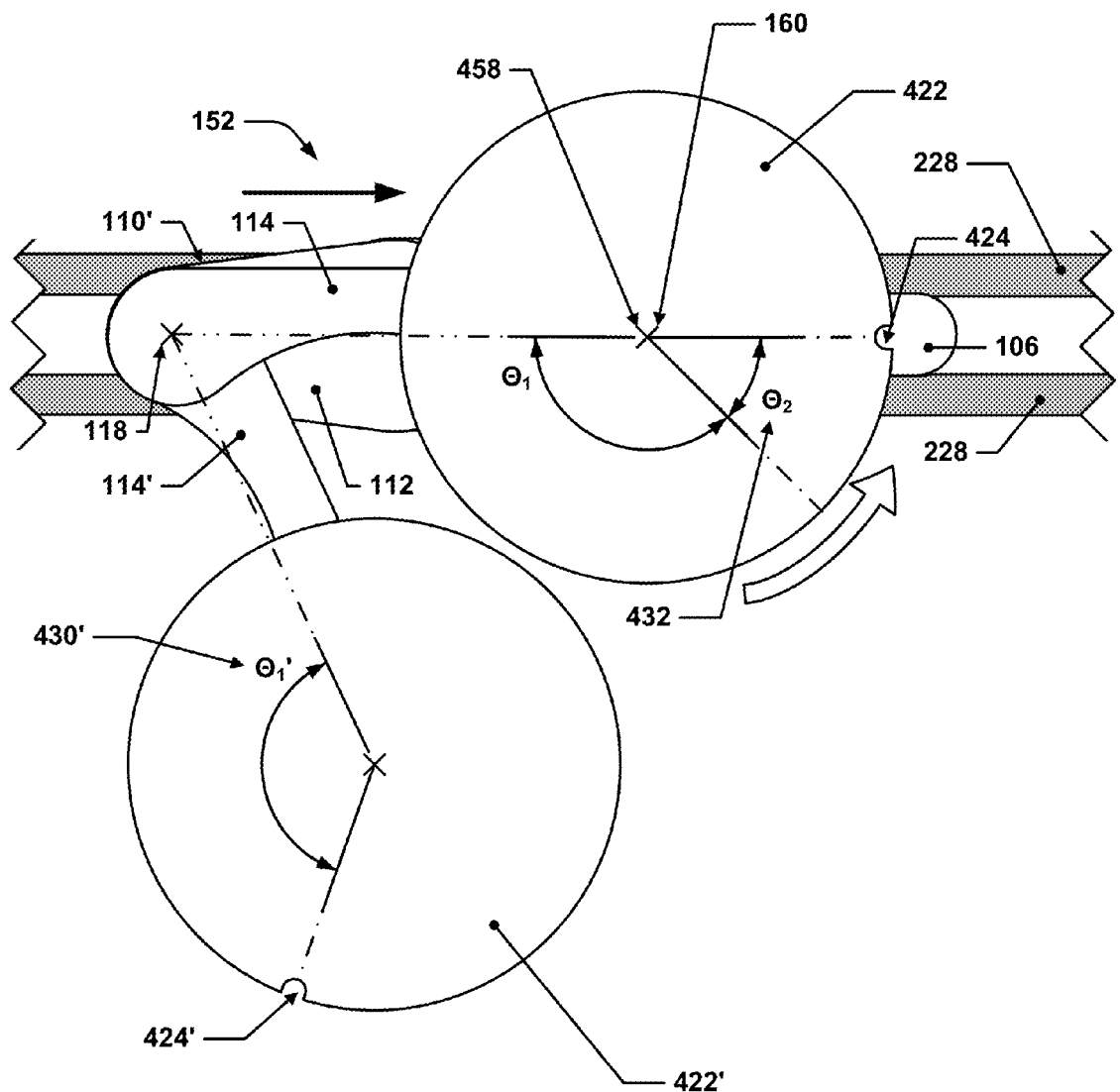
FIG. 5B shows another phase of handling multiple semiconductor wafers by a robot with an integrated aligner including two robotic arms.

In FIG. 5A, the additional second link 114', shown in FIG. 5B, may not yet have picked a semiconductor wafer. In the implementation shown in FIG. 5A, the second link 114 may pick a semiconductor wafer from the first location 438 while the additional second link 114' may also pick a second semiconductor wafer from the first location 438 in a subsequent pick operation after the second link 114 and its semiconductor wafer have rotated clear of the first location 438. In other implementations, the additional second link 114' may pick a second semiconductor wafer from a third location not visible in FIG. 5A, e.g., a location directly beneath the first location 438 (in which case both the second link 114 and the additional second link 114' may more or less pick their respective semiconductor wafers simultaneously). If the additional second link 114' is configured to pick a second semiconductor wafer from a third location that is in a different horizontal location than the first location, the double robotic arm 110' may reposition itself in the time period after the second link 114 picks a semiconductor wafer and before the additional second link 114' picks a second semiconductor wafer. During the time period when the double robotic arm 110' repositions itself, the positioning mechanism may move the double-armed robot 152 to a third position not visible in FIG. 5A to allow the double robot arm 110' to access the third location.

In the implementation shown, the second link 114 may be configured to rotate to a new position before the additional second link 114' may pick the second semiconductor wafer to decrease the total time required to rotate both the semiconductor wafer 422 and the second semiconductor wafer 422'. Also in other implementations, the additional second link 114' may pick the second semiconductor wafer before, at the same time as, or after the second link 114 picks a semiconductor wafer. In FIG. 5A, the semiconductor wafer 422 has not yet been rotated to the desired orientation. The semiconductor wafer 422 may be in an orientation defined by the first angle 430. The first angle 430 may be $\Theta_1$. The orientation of the semiconductor wafer 422 may be similar to the orientation of the semiconductor wafer in FIG. 4A.

FIG. 5B shows another phase of handling multiple semiconductor wafers by a robot with an integrated aligner including two robotic arms.

In FIG. 5B, the semiconductor wafer 422 has been placed on the rotatable wafer support. As stated in the description of FIG. 4B, different implementations may place the semiconductor wafer on the rotatable wafer support through a variety of approaches. The double-armed robot 152 in FIG. 5B may be configured to place the semiconductor wafer 422 on the rotatable wafer support in a manner similar to those discussed with respect to FIG. 4B.

In the implementation in FIG. 5B, second link 114 has placed the semiconductor wafer 422 on the rotatable wafer support. This may be followed by the rotatable wafer support rotating the semiconductor wafer 422 and the second link 114 picking the semiconductor wafer 422 from the rotatable wafer support before the additional second link 114' places the second semiconductor wafer 422' on the rotatable wafer support. In other implementations, the additional second link 114' may place the second semiconductor wafer 422' on the rotatable wafer support, followed by the rotatable wafer support rotating the second semiconductor wafer 422' and the additional second link 114' picking the second semiconductor wafer 422' from the rotatable wafer support before the second link 114 may place the semiconductor wafer 422 on the rotatable wafer support. Other implementations may be configured such that either the semiconductor wafer 422 or the second semiconductor wafer 422' may be placed on the rotatable wafer support first.

When the semiconductor wafer 422 is placed on the rotatable wafer support 108, the wafer center axis 458 may be coaxial or substantially coaxial with the rotational axis 160. There may be some minor mismatch between the two axes due to tolerancing, slop in the robotic arm, etc., although the semiconductor wafer may be viewed as being generally centered on the rotational axis of the rotatable wafer support.

In FIG. 5B, the semiconductor wafer 422 may be rotated by the rotatable wafer support into the desired orientation. The semiconductor wafer 422 contains the alignment feature 424. The alignment feature of 424 may be configured to interact with a sensor in orienting the semiconductor wafer 422 to the desired orientation, similar to how the alignment feature in FIG. 4C interacts with a sensor to orient the semiconductor wafer, when the semiconductor wafer 422 is rotated by the rotatable wafer support. The configuration of the alignment feature 424 may be similar to the configuration of the alignment feature in FIG. 4C.

In the implementation shown in FIG. 5B, the angle of rotation needed for the semiconductor wafer 422 to be in the desired orientation may be the second angle 432. The second angle 432 may be $\Theta_2$. The $\Theta_2$ needed for a semiconductor wafer to be rotated into the desired orientation may be different for each individual semiconductor wafer. The rotatable wafer support on double-armed robot 152 in FIG. 5B may be configured to rotate through $\Theta_2$ similar to how the rotatable wafer support on the robot in FIG. 4C may be configured to rotate through $\Theta_2$.

In FIG. 5B, the second link 114' may have picked a second semiconductor wafer 422' from a third location separate from the first location 438. The third location is not shown in the figures, but may be a station in a semiconductor process chamber, a front opening unified pod, a load-lock, a transfer chamber, or another station in a semiconductor processing tool.

In FIG. 5B, the second semiconductor wafer 422' has not yet been placed on the rotatable wafer support. In some implementations, during the period from when the semiconductor wafer 422 is being placed on the rotatable wafer support to when the semiconductor wafer 422 is picked from the rotatable wafer support, corresponding to blocks 304, 306, and 308 in FIG. 3, the second link 114' may support the second semiconductor wafer 422' in a position such that the second semiconductor wafer 422' is not in the area of the projection of the semiconductor wafer 422 along the wafer center axis 458, or is at least positioned such that it does not interfere with placing and picking the semiconductor wafer 422 on or from the rotatable wafer support 108 or with the rotation of the semiconductor wafer 122 by the rotatable wafer support 108.

In the implementation in FIG. 5B, the double-armed robot 152 has one rotatable wafer support and may rotate one semiconductor wafer at any given time. Other implementations may have multiple rotatable wafer supports to allow multiple semiconductor wafers to be rotated at the same time.

Figure 5C:
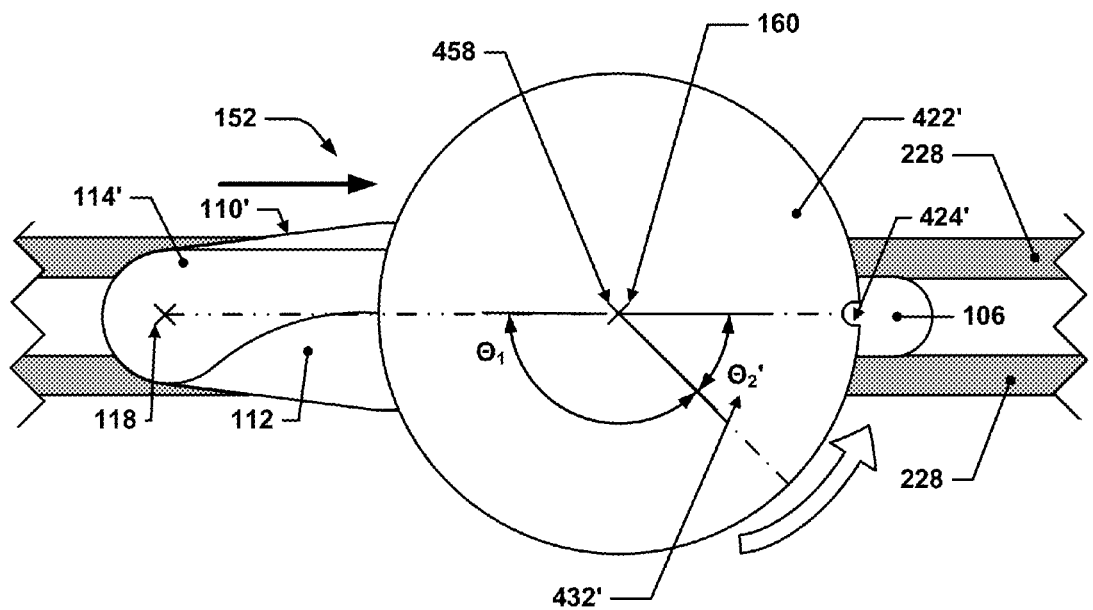
FIG. 5C shows yet another phase of handling multiple semiconductor wafers by a robot with an integrated aligner including two robotic arms.
Figure 5D:
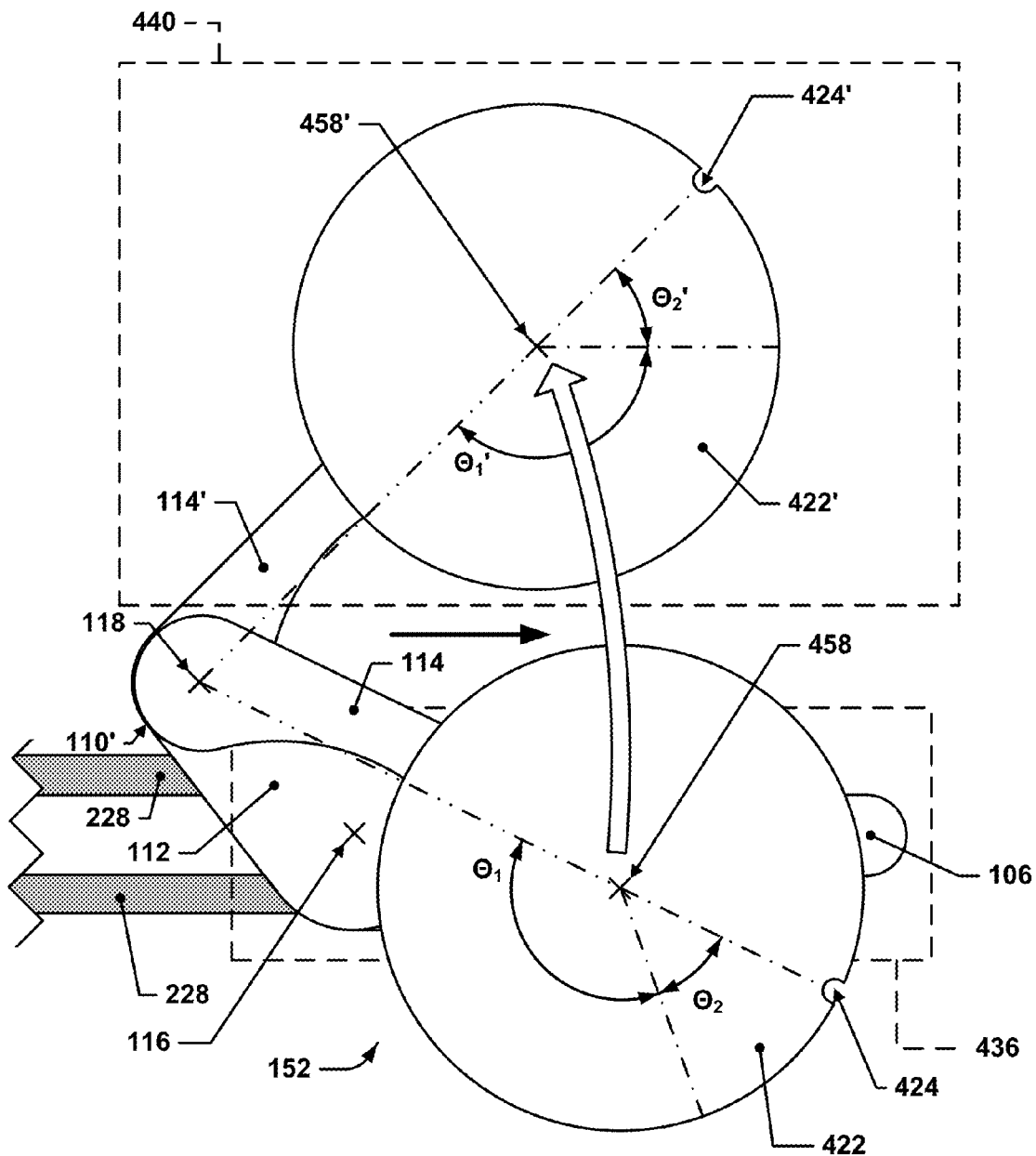
FIG. 5D shows an additional phase of handling multiple semiconductor wafers by a robot with an integrated aligner including two robotic arms.

The double-armed robot 152 in FIG. 5B may be moving (as shown by the arrow pointing to the right in the Figure) from the first position 434, shown in FIG. 5A, to the second position 436, shown in FIG. 5D. The positioning mechanism configured to move the robot may be similar in configuration to the positioning mechanism in FIGS. 4A to 4D. The positioning mechanism in FIG. 5B may move the double-armed robot 152 during a period similar to the period the positioning mechanism of robot 102 moves the robot 102 in FIGS. 4A to 4D. In other implementations, the double-armed robot may wait until the semiconductor wafer 422 is aligned and retrieved by the second link 114 before depositing the second semiconductor wafer 422' on the rotatable wafer support 108 and moving the base 106 using the positioning mechanism; this may allow the corridor through which the double-armed robot 102 translates to have a reduced width, e.g., slightly wider than the diameter of the semiconductor wafer, when the double-armed robot 152 is configured to only move when the semiconductor wafer 422 is substantially above the second semiconductor wafer 422' and the rotatable wafer support.

FIG. 5C shows yet another phase of handling multiple semiconductor wafers by a robot with an integrated aligner including two robotic arms.

In FIG. 5C, the rotatable wafer support has finished rotating the semiconductor wafer 422 into an aligned orientation and the second link 114 has picked the semiconductor wafer 422 from the rotatable wafer support. The second link 114 may be configured to pick the semiconductor wafer 422 from the rotatable wafer support in the same manner or a similar manner as the second link in FIG. 4C. In the implementation shown, the second link 114 is above the additional second link 114'. The semiconductor wafer 422 is above the second semiconductor wafer 422'. In FIG. 5C, the second link 114 and the semiconductor wafer 422 are not shown, though they are above the additional second link 114' and the second semiconductor wafer 422'. Instead, FIG. 5C shows the additional second link 114' and the second semiconductor wafer 422'.

In FIG. 5C, after the semiconductor wafer 422 has been picked from the rotatable wafer support by the second link 114, the additional second link 114' then places the second semiconductor wafer 422' on the rotatable wafer support similar to how the second link 114 places the semiconductor wafer 422 on the rotatable wafer support. The rotatable wafer support may then rotate the second semiconductor wafer 422' into the desired orientation by an additional second angle 432'. The additional second angle 432' may be $\Theta_2'$ and the rotatable wafer support of the double-armed robot 152 in FIG. 5C may be configured to rotate through $\Theta_2'$ similar to how the rotatable wafer support of the robot in FIG. 4C may be configured to rotate through $\Theta_2$. After the rotatable wafer support rotates the second semiconductor wafer 422' into the desired orientation, the additional second link 114' may then pick the second semiconductor wafer 422' from the rotatable wafer support similar to how the second link 114 may pick the semiconductor wafer 422 from the rotatable wafer support. The second link 114 may support the semiconductor wafer 422 in a position substantially above the additional second link 114' during the period from when the additional second link 114' places the second semiconductor wafer 422' on the rotatable wafer support to when the additional second link 114' picks the second semiconductor wafer 422' from the rotatable wafer support.

Similar to FIG. 5B, the double-armed robot 152 in FIG. 5C may be moving from the first position 434 (not visible in FIG. 5C, but shown in FIG. 5A) to the second position 436 (not visible in FIG. 5C, but shown in FIG. 5D). The positioning mechanism of the double-armed robot 152 in FIG. 5C may be configured to move the double-armed robot 152 in a manner similar to the configuration of the positioning mechanism of the robot in FIGS. 4A to 4D.

FIG. 5D shows an additional phase of handling multiple semiconductor wafers by a robot with an integrated aligner including two robotic arms.

In FIG. 5D, the double-armed robot 152 has been moved to the second position 436 through the positioning mechanism of the track guides 228. The positioning mechanism in FIG. 5B may move the robot 152 in a manner similar to the manner the positioning mechanism moves the robot in FIGS. 4A to 4D.

In FIG. 5D, both the semiconductor wafer 422 and the semiconductor wafer 422' have been rotated into the desired orientation by the rotatable wafer support. The second link 114 is supporting the semiconductor wafer 422. The additional second link 114' is supporting the second semiconductor wafer 422'.

In the implementation in FIG. 5D, the double-armed robot 152 may be configured to place the second semiconductor wafer 422' in the second location 440 before the semiconductor wafer 422 is placed in a location. Other implementations may be configured to place the semiconductor wafer 422 before the semiconductor wafer 422', or there may be no specific preference for which semiconductor wafer is to be placed first.

In FIG. 5D, the double robotic arm 110' of the double-armed robot 152 is in the extended configuration with respect to the additional second link 114'. The additional second link 114' may be, from the perspective of the viewer, underneath the second link 114. In the implementation shown, after the second semiconductor wafer 422' has been placed in the second location 440, the double robotic arm 110' may then reposition itself to place the semiconductor wafer 422 in the second location 440. In other implementations, the double robotic arm 110' may place the semiconductor wafer 422 in a fourth location not visible in FIG. 5D. The fourth location may be a location directly beneath the second location 440, in which case both the second link 114 and the additional second link 114' may more or less place their respective wafers simultaneously, or the fourth location may be a location that is in a different horizontal location than the second location 440. If the fourth location is in a different horizontal location than the second location 440, the double robotic arm 110' may, after the second semiconductor wafer 422' has been placed in the second location 440, reposition itself so that the second link 114 may place the semiconductor wafer 422 in the fourth location. During the time period when the double robotic arm 110' repositions itself, the positioning mechanism may move the double-armed robot 152 to a fourth position not visible in FIG. 5A. The second location 440 as well as the fourth location may be similar in configuration to the second location in FIG. 4D and may be any type of station in a semiconductor processing tool as previously discussed.

In other implementations, the picking, rotating, and placing of the semiconductor wafer and the second semiconductor wafer may be carried out in different sequences. For example, a certain implementation may use the following sequence: 1) The double-armed robot is in the first position. 2) The second link picks the semiconductor wafer from the first location and places the semiconductor wafer on the rotatable wafer support. 3) The rotatable wafer support rotates the semiconductor wafer. 4) The second link picks the semiconductor wafer from the rotatable wafer support. 5) The additional second link picks the second semiconductor wafer from the first or a third location and places the second semiconductor wafer on the rotatable wafer support. 6) The rotatable wafer support rotates the second semiconductor wafer. 7) The positioning mechanism moves the double-armed robot from the first position to the second position while the rotatable wafer support rotates the second semiconductor wafer. 8) The additional second link picks the second semiconductor wafer from the rotatable wafer support. 9) The second link places the semiconductor wafer in the second location. 10) The additional second link places the second semiconductor wafer in the second or fourth location. Additional varieties of sequences may be possible for picking, placing, and rotating one or multiple semiconductor wafers as well as repositioning the robot. The approaches outlined in this description are not intended to be limiting.

Figure 6A:
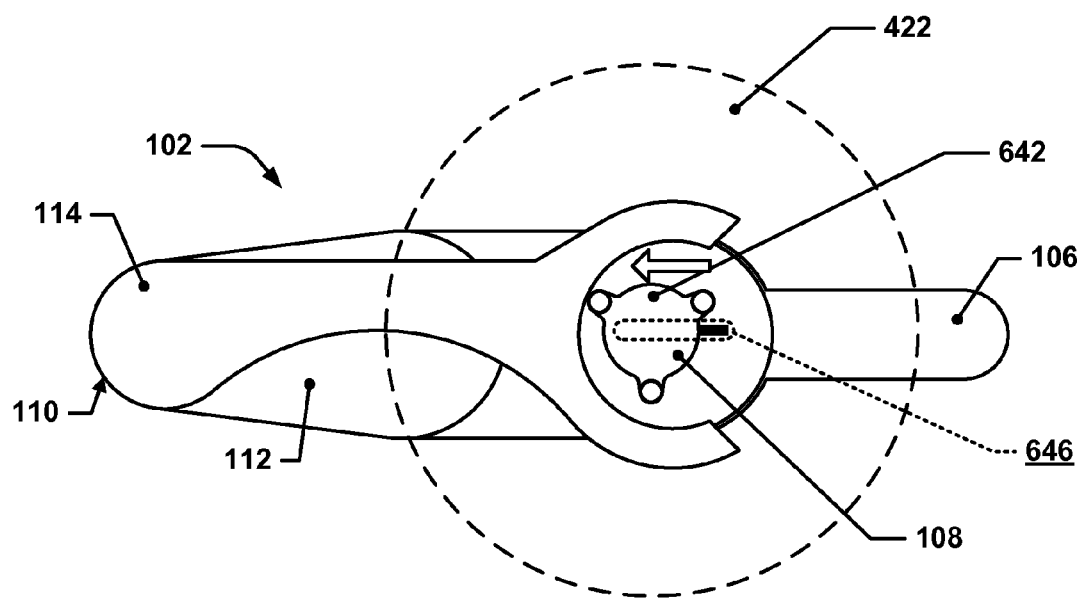
FIG. 6A shows an example of a robot with a rotatable wafer support configured to translate with respect to the base.

FIG. 6A shows an example of a robot with a rotatable wafer support configured to translate with respect to the base by way of a rotatable wafer support translation mechanism. The robot 102 may be similar in configuration to the robot in FIG. 1A.

In certain implementations, the semiconductor wafer may not be supported by the second link in the correct horizontal position relative to the second link, for a variety of reasons. In situations where the semiconductor wafer is not in the correct horizontal position relative to the second link, the wafer center axis 458 may not be coaxial or substantially coaxial with the rotational axis 160 when the semiconductor wafer is placed on the rotatable wafer support by the second link. If the rotatable wafer support is configured to translate, this may allow the rotatable wafer support to be moved such that the rotational axis 160 is coaxial or substantially coaxial with the wafer center axis 458, even if the semiconductor wafer was not in the correct horizontal position on the second link, by translating the rotatable wafer support into a position such that the rotational axis 160 is coaxial or substantially coaxial with the wafer center axis 458 before the semiconductor wafer is placed on the rotatable wafer support by the second link.

In FIG. 6A, the rotatable wafer support 108 may, in addition to providing for rotational movement of the wafer about the rotational axis of the rotatable wafer support 108, be configured to translate in one or more directions orthogonal to the rotational axis of the rotatable wafer support 108 by the rotatable wafer support translation mechanism 646. In the implementation shown in FIG. 6A, the rotatable wafer support 108 may be configured to translate in the lengthwise direction of the base 106. In other implementations, the rotatable wafer support 108 may be configured to translate in the widthwise direction of the base 106 or in other directions orthogonal to the rotational axis of the rotatable wafer support 108. In FIG. 6A, the rotatable wafer support 108 is in a first support position 642. The rotatable wafer support translation mechanism 646 is identified by a dashed ellipse.

Figure 6B:
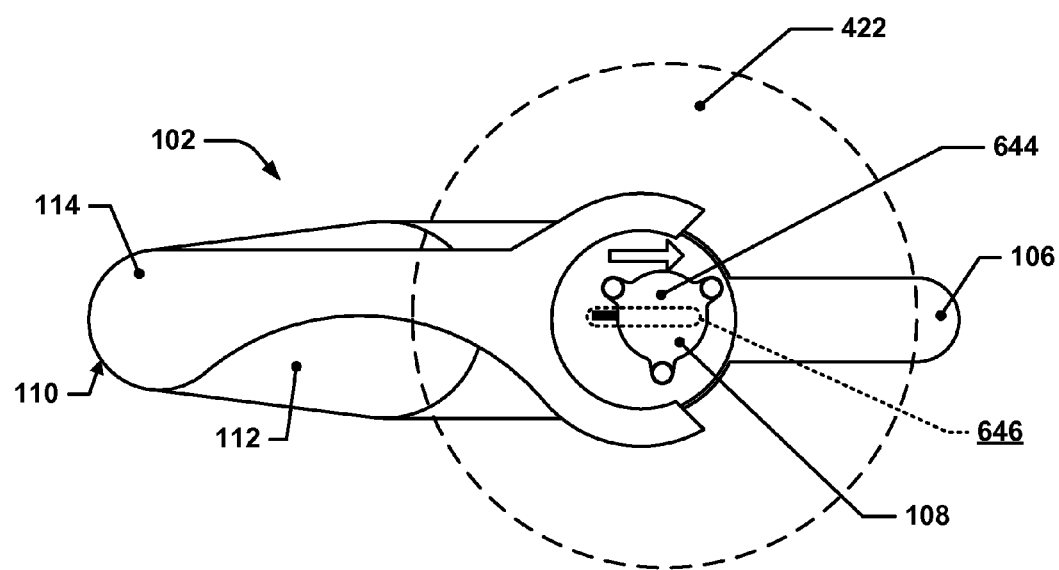
FIG. 6B shows the example of the robot of FIG. 6A with the rotatable wafer support translated with respect to the position shown in FIG. 6A.

FIG. 6B shows the example of the robot of FIG. 6A with the rotatable wafer support translated with respect to the position shown in FIG. 6A. The configuration of the robot 102 in FIG. 6B may be similar to the configuration of the robot in FIG. 6A. In FIG. 6B, the rotatable wafer support 108 has translated from the first support position 642, as shown in FIG. 6A, to a second support position 644, by way of the rotatable wafer support translation mechanism 646. In this implementation, the rotatable wafer support 108 has translated to the second support position 644 while supporting the semiconductor wafer 422, but the rotatable wafer support 108 may also translate while not supporting a semiconductor wafer.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed. Additionally, the individual features of the configurations described herein are only exemplary in nature. When an individual feature is not specifically described as exclusive to certain other features, the individual feature is not exclusive with other features. Therefore, the individual feature not specifically described as exclusive to other features may be combined in any number of different combinations with other features.

What is claimed is:
1. An apparatus comprising:
a base configured to be installed in a semiconductor tool;
a rotatable wafer support configured to rotate about a rotational axis, wherein:
   the rotatable wafer support is directly or indirectly supported by the base, and
   the rotatable wafer support is configured to support a semiconductor wafer such that the semiconductor wafer is substantially centered on the rotational axis;
a first robotic arm, including:
   a first end rotatably connected to the base,
   a second end configured to support the semiconductor wafer,
   a first link connected to the base,
   a second link connected to the first link,
   a first pivot joint, and
   a second pivot joint; and
a positioning mechanism configured to translate the base, including the first robotic arm and the rotatable wafer support, from a first position to a second position, wherein:
   the rotatable wafer support is separate from the second end,
   the first robotic arm is configured to place the semiconductor wafer on the rotatable wafer support, the rotatable wafer support is configured to rotate the semiconductor wafer after the semiconductor wafer is placed on the rotatable wafer support, the first pivot joint provides for rotational motion of the first link with respect to the base about a first pivot rotational axis, the second pivot joint provides for rotational motion of the second link with respect to the first link about a second pivot rotational axis, and a first link distance between the first pivot rotational axis and the second pivot rotational axis is less than a second link distance between the second pivot rotational axis and a wafer reference axis, the wafer reference axis defined as being coaxial with a wafer center axis of the semiconductor wafer when the semiconductor wafer is supported by the second end.

2. The apparatus of claim 1, wherein the first robotic arm is a multi-link arm.

3. The apparatus of claim 2, wherein the multi-link arm includes at least two links and the two links are configured to be at an acute angle with respect to one another when the first robotic arm is in position for placing the semiconductor wafer on the rotatable wafer support.

4. The apparatus of claim 1, further comprising a sensor, wherein the sensor is configured to determine when the semiconductor wafer is in an aligned position on the rotatable wafer support.

5. The apparatus of claim 1, further comprising a rotatable wafer support translation mechanism configured to translate the rotatable wafer support relative to the base in a plane substantially normal to the rotational axis.

6. The apparatus of claim 1, further comprising a second robotic arm.

7. An apparatus comprising:
a positioning mechanism;
a base, wherein the positioning mechanism is configured to move the base between a plurality of positions within the apparatus;
a rotatable wafer support configured to rotate about a rotational axis, wherein the rotatable wafer support:
is directly or indirectly supported by the base,
moves with the base, and
is configured to support a semiconductor wafer; and
a first robotic arm, including:
a first end rotationally connected to the base;
a second end configured to support the semiconductor wafer;
a first link connected to the base;
a second link connected to the first link;
a first pivot joint; and
a second pivot joint, wherein:
the first robotic arm is configured to place the semiconductor wafer on the rotatable wafer support such that the semiconductor wafer is substantially centered on the rotational axis,
the rotatable wafer support is configured to rotate the semiconductor wafer after the semiconductor wafer is placed on the rotatable wafer support,
the rotatable wafer support is separate from the second end,
the first pivot joint provides for rotational motion of the first link with respect to the base about a first pivot rotational axis,
the second pivot joint provides for rotational motion of the second link with respect to the first link about a second pivot rotational axis, and
a first link distance between the first pivot rotational axis and the second pivot rotational axis is less than a second link distance between the second pivot rotational axis and a wafer reference axis, the wafer reference axis defined as being coaxial with a wafer center axis of the semiconductor wafer when the semiconductor wafer is supported by the second end.

8. The apparatus in claim 7, wherein the first robotic arm is a multi-link arm.

9. The apparatus in claim 8, wherein the multi-link arm includes at least two links and the two links are configured to be at an acute angle with respect to one another when the first robotic arm is in position for placing the semiconductor wafer on the rotatable wafer support.

10. The apparatus in claim 7, wherein the positioning, mechanism further comprises a track guide.

11. An apparatus comprising:
a first location;
a second location;
a base;
a rotatable wafer support directly or indirectly supported by the base, wherein the rotatable wafer support is configured to support a semiconductor wafer;
a first robotic arm, including:
a first end rotationally connected to the base,
a second end configured to support the semiconductor wafer,
a first link connected to the base,
a second link connected to the first link,
a first pivot joint, and
a second pivot joint; and
a controller with one or more processors and a memory, wherein the one or more processors, the memory, the first robotic arm, and the rotatable wafer support are communicatively coupled and the memory stores program instructions for controlling the one or more processors to:
cause the first robotic arm to pick the semiconductor wafer from the first location,
cause the first robotic arm to place the semiconductor wafer on the rotatable water support,
cause the rotatable wafer support to align the semiconductor wafer after the semiconductor wafer is placed on the rotatable wafer support by rotating the rotatable wafer support,
cause the first robotic arm to pick the semiconductor wafer from the rotatable wafer support after the semiconductor wafer has been aligned, and
cause the first robotic arm to place the semiconductor wafer into the second location, wherein:
the rotatable wafer support is separate from the second end,
the base, including the first robotic arm and the rotatable wafer support, is configured to be movable between different positions within the apparatus,
the first pivot joint provides for rotational motion of the first link with respect to the base about a first pivot rotational axis,
the second pivot joint provides for rotational motion of the second link with respect to the first link about a second pivot rotational axis, and
a first link distance between the first pivot rotational axis and the second pivot rotational axis is less than a second link distance between the second pivot rotational axis and a wafer reference axis, the wafer reference axis defined as being coaxial with a wafer center axis of the semiconductor wafer when the semiconductor wafer is supported by the second end.

12. The apparatus in claim 11, wherein the first location is a semiconductor wafer cassette.

13. The apparatus in claim 11, wherein the second location is a load-lock.

14. The apparatus in claim 11, wherein the memory further comprises program instructions for controlling the one or more processors to:
  cause the base to move from a first position to a second position; and
  cause the base to move from the second position to the first position.

15. The apparatus in claim 11, further comprising a second robotic arm, wherein:
  the one or more processors, the memory, the first robotic arm, the second robotic arm, and the rotatable wafer support are communicatively coupled; and
  the memory stores further program instructions for controlling the one or more processors to:
    cause the second robotic arm to pick a second semiconductor wafer from a third location,
    cause the second robotic arm to place the second semiconductor wafer on the rotatable wafer support;
    Cause the rotatable wafer support to align the second semiconductor wafer after the second semiconductor wafer is placed on the rotatable wafer support by rotating the rotatable wafer support,
    cause the second robotic atm to pick the second semiconductor wafer from the rotatable wafer support after the second semiconductor wafer has been aliened, and
    cause the second robotic arm to place the semiconductor wafer into the second location or a fourth location.

* * * * *